United States Patent
Haque et al.

Patent Number: 5,919,608
Date of Patent: Jul. 6, 1999

[54] MEDIUM AND PROCESS FOR GENERATING ACID USING SENSITIZING DYE AND SUPERSENSITIZER

[75] Inventors: Serajul Haque, Braintree; John L. Marshall, Somerville; Stephen J. Telfer, Arlington, all of Mass.

[73] Assignee: Polaroid Corporation, Cambridge, Mass.

[21] Appl. No.: 08/960,162

[22] Filed: Oct. 29, 1997

[51] Int. Cl.$^6$ .............. G03C 1/725; G03C 1/73; G03C 1/735
[52] U.S. Cl. .......... 430/332; 430/270.1; 430/333; 430/334; 430/336; 430/338; 430/340
[58] Field of Search .............. 430/270.1, 332, 430/333, 334, 336, 338, 340

[56] References Cited

U.S. PATENT DOCUMENTS

| | | | |
|---|---|---|---|
| 5,225,316 | 7/1993 | Vogel et al. | 430/270.1 |
| 5,258,274 | 11/1993 | Helland et al. | 430/522 |
| 5,286,612 | 2/1994 | Telfer | 430/335 |
| 5,314,795 | 5/1994 | Helland et al. | 430/517 |
| 5,401,607 | 3/1995 | Takiff et al. | 430/270.1 |
| 5,422,230 | 6/1995 | Boggs et al. | 430/338 |
| 5,441,850 | 8/1995 | Marshall et al. | 430/336 |
| 5,451,478 | 9/1995 | Boggs et al. | 430/11 |
| 5,453,345 | 9/1995 | Grasshoff et al. | 430/270 |
| 5,578,424 | 11/1996 | Grasshoff et al. | 430/333 |
| 5,582,956 | 12/1996 | Ehret et al. | 430/337 |
| 5,631,118 | 5/1997 | Gaudiana et al. | 430/270.1 |
| 5,741,630 | 4/1998 | Marshall et al. | 430/337 |
| 5,763,134 | 6/1998 | Busman et al. | 430/157 |

*Primary Examiner*—Geraldine Letscher
*Attorney, Agent, or Firm*—David J. Cole

[57] ABSTRACT

The sensitivity to radiation of combinations of cationic electron acceptors (such as phosphonium, sulfonium, diazonium and iodonium salts) with sensitizing dyes, which sensitize these cationic electron acceptors to wavelengths (typically visible wavelengths) to which they are not sensitive in the absence of the dye, can be increased by including with the cationic electron acceptor and the sensitizing dye a supersensitizer which has an oxidation potential lower than that of the sensitizing dye, the supersensitizer being an ionic compound having a cation comprising an ionic grouping, said grouping comprising at least one atom of an element from Group VB, VIB or VIIB of the Periodic Table. An imaging medium has an acid-generating layer comprising this cationic electron acceptor/sensitizing dye/supersensitizer combination together with a secondary acid generator capable of thermal decomposition to form a secondary acid, the thermal decomposition of the secondary acid generator being catalyzed by the acid generated from the cationic electron acceptor, and a color change layer comprising an image dye which undergoes a color change in the presence of the secondary acid.

41 Claims, 3 Drawing Sheets

MEDIUM AND PROCESS FOR GENERATING ACID USING SENSITIZING DYE AND SUPERSENSITIZER

BACKGROUND OF THE INVENTION

This invention relates to a medium and process for generating acid using a sensitizing dye and a supersensitizer. More specifically, this invention relates to such a medium and process which improves the radiation sensitivity of cationic electron acceptors.

It has long been known that certain cationic electron acceptors (for example, certain phosphonium, sulfonium, diazonium and iodonium salts, and certain pyridinium and pyrylium compounds) will generate powerful acids when exposed to electromagnetic radiation of an appropriate wavelength. Most such cationic electron acceptors are themselves only sensitive to far ultra-violet radiation (below about 300 nm), but they can be used in conjunction with a sensitizing dye which sensitizes the cationic electron acceptor to longer wavelength radiation in the near ultra-violet, visible or even infra-red ranges. The acid generated from the cationic electron acceptors can be used for a variety of purposes, for example polymerization, depolymerization, or causing a color change in an indicator dye; imagewise exposure of a medium containing an cationic electron acceptor and such an indicator dye may be used to form an image.

For example, U.S. Pat. Nos. 5,286,612; 5,453,345 and 5,578,424 describe processes for generation of acid from a cationic electron acceptor (usually an iodonium salt) using an imagewise infra-red exposure in the presence of a sensitizing dye followed by a blanket ultra-violet exposure. In a preferred process, the acid generated from the cationic electron acceptor (this acid is referred to in these patents as a "superacid" and may hereinafter be referred to as the "primary acid") is heated while admixed with a secondary acid generator, a compound capable of undergoing thermal decomposition to produce a secondary acid, the thermal decomposition of the secondary acid generator being catalyzed by the primary acid. The heating of the primary acid/secondary acid generator mixture causes "amplification" of the primary acid, that is to say each mole of primary acid present as a result of the infra-red and ultra-violet exposures produces multiple moles of secondary acid. The preferred secondary acid generators described in this patent are squaric acid derivatives and oxalates, and the secondary acid may be used to change the color of an indicator dye.

U.S. Pat. No. 5,401,607 describes a process for generating acid by exposing a mixture of a diaryliodonium salt and a squarylium dye to infra-red radiation.

U.S. Pat. Nos. 5,422,230 and 5,451,478 describe a process in which the process of the aforementioned U.S. Pat. No. 5,286,612 is used to create a slide which does not require chemical development.

U.S. Pat. Nos. 5,441,850 and 5,631,118 describe processes generally similar to that of the aforementioned U.S. Pat. No. 5,286,612, but in which the imagewise exposure can be in the visible region. In these patents, the sensitizing dye has a first form which absorbs strongly at the wavelength used for the exposure and thus sensitizes the cationic electron acceptor to this wavelength, and a second form which has much lower absorption at this wavelength. The latter patent mentions that it is desirable that the layer or phase containing the sensitizing dye and the cationic electron acceptor also comprise a supersensitizer (called a "cosensitizer" in this patent), which is a reducing agent less basic than the secondary acid generator; the presence of such a supersensitizer greatly improves the quantum efficiency of the reaction between the photoexcited sensitizing dye and the cationic electron acceptor, and thus the sensitivity of the imaging medium. Preferred supersensitizers include triarylamines (for example, triphenylamine) and hydroquinones.

U.S. Pat. No. 5,582,956 describes processes which are generally similar to those of the aforementioned U.S. Pat. Nos. 5,441,850; 5,631,118 and 5,286,612, but in which, following the color change in the indicator, there is reacted with the cationic electron acceptor a reactive material which irreversibly destroys this acceptor, thus rendering the imaging medium insensitive to radiation and fixing the image.

Application Ser. No. 08/757,195, filed Nov. 27, 1996, describes processes which are generally similar to those of the aforementioned U.S. Pat. Nos. 5,441,850; 5,631,118 and 5,286,612, but in which the secondary acid generator has a first site bearing a first leaving group and a second site bearing a second leaving group, the first leaving group being capable of protonation by the primary acid produced by the cationic electron acceptor, with expulsion of the first leaving group, followed by loss of a proton from the secondary acid generator to form an unstable intermediate, which then fragments with loss of the second leaving group, accompanied by either (a) loss of a second proton; or (b) addition of a proton-containing nucleophile, followed by loss of a proton, the second leaving group, in combination with a proton, forming the secondary acid. Preferably, the secondary acid is capable of protonating the first leaving group of the secondary acid generator, so that the thermal decomposition of the secondary acid generator is autocatalytic. The imaging medium may include a supersensitizer of the types previously described.

Application Ser. No. 08/944,284, filed Oct. 6, 1997 describes processes which closely resemble that of the aforementioned application Ser. No. 08/757,195 and which uses a secondary acid generator having a first site bearing a first leaving group and a second site bearing a second leaving group, the first leaving group being capable of protonation by the acid produced by the cationic electron acceptor, with expulsion of the first leaving group. However, in this application, the cation formed by expulsion of the first leaving group electrophilically adds to an unsaturated reagent bearing a proton at the site of addition and a proton-containing nucleophilic grouping at an adjacent site. After this electrophilic addition, the proton on the reagent is lost and the second leaving group of the secondary acid generator is displaced by the nucleophilic grouping on the reagent. As in the application Ser. No. 08/757,195, the second leaving group, in combination with a proton, forms the secondary acid.

The entire disclosures of the aforementioned patents and applications, all of which are assigned to the same assignee as the present application, are herein incorporated by reference.

It has now been found that the sensitivity of acid-generating media comprising a cationic electron acceptor, a sensitizing dye and a supersensitizer can be markedly increased by using as the supersensitizer a compound containing certain ionic groupings.

SUMMARY OF THE INVENTION

Accordingly, this invention provides a process for generation of acid, which process comprises forming an acid-generating composition comprising:

a cationic electron acceptor capable of decomposing to give an acid;

a sensitizing dye which sensitizes the cationic electron acceptor to electromagnetic radiation of a wavelength to which the cationic electron acceptor is essentially insensitive in the absence of the sensitizing dye; and a supersensitizer having an oxidation potential lower than that of the sensitizing dye, the supersensitizer being an ionic compound having a cation comprising an ionic grouping, said grouping comprising at least one atom of an element from Group VB, VIB or VIIB of the Periodic Table;

and exposing at least part of the acid-generating composition to electromagnetic radiation of a wavelength absorbed by the sensitizing dye, thereby generating the acid.

This invention also provides an acid-generating composition comprising:

a cationic electron acceptor capable of decomposing to give an acid;

a sensitizing dye which sensitizes the cationic electron acceptor to electromagnetic radiation of a wavelength to which the cationic electron acceptor is essentially insensitive in the absence of the sensitizing dye; and a supersensitizer having an oxidation potential lower than that of the sensitizing dye, the supersensitizer being an ionic compound having a cation comprising an ionic grouping, said grouping comprising at least one atom of an element from Group VB, VIB or VIIB of the Periodic Table.

DETAILED DESCRIPTION OF THE INVENTION

Figure 1A:
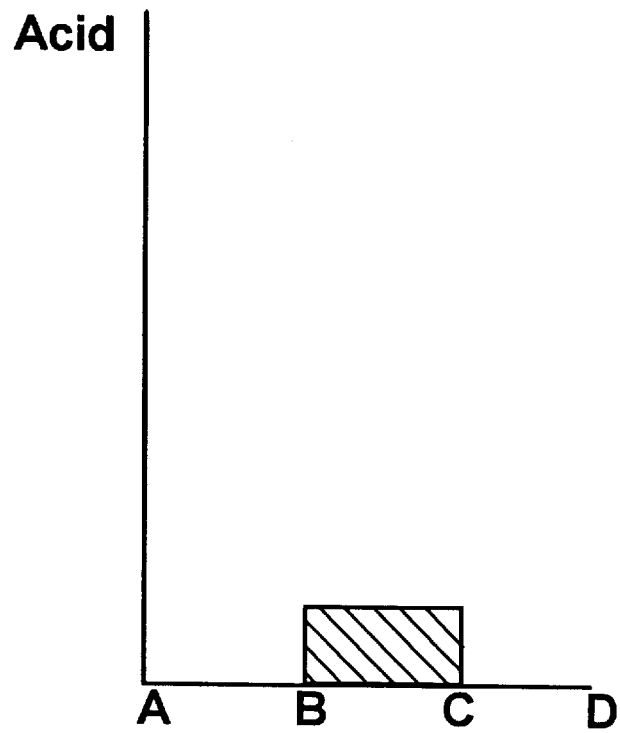
FIGS. 1A–1C show the acid concentrations in the exposed and non-exposed regions of the acid-generating layer during the various steps of a first preferred process of the present invention.

As already mentioned, in the process of the present invention the cationic electron acceptor and sensitizing dye are used in conjunction with a ionic supersensitizer having an oxidation potential lower than that of the sensitizing dye and having a cation comprising an ionic grouping comprising at least one atom of an element from Group VB, VIB or VIIB of the Periodic Table. Appropriate ionic groupings include ammonium, phosphonium, arsonium, sulfonium and iodonium groups. Although the optimum oxidation potential for the supersensitizer may vary with the oxidation potential of the sensitizing dye, in general it is preferred that the supersensitizer have an oxidation potential of from about 700 to about 1100 mV relative to a standard calomel electrode. Specific preferred ionic groupings which have been found to give good results in the present process include tetra- and trisubstituted ammonium and phosphonium groupings, pyridinium groupings and disubstituted iodonium groupings, where in each case the substituents may be alkyl or aryl groups.

In one useful group of supersensitizers, the ionic grouping is connected to a triarylamino grouping; in a preferred subgroup of these supersensitizers, the ionic grouping is bonded to an alkyl, alkenyl, alkoxy, alkoxyalkyl or oxyalkoxy grouping, and this alkyl, alkenyl, alkoxy, alkoxyalkyl or oxyalkoxy grouping forms a substituent on one of the aryl groups of the triarylamino grouping. These preferred "triarylamino" supersensitizers have the advantage that synthetic routes to these compounds are well known and well understood, and permit synthesis with a wide variety of substituents bearing ionic groupings. Furthermore, additional substituents can readily be introduced on to the two aryl groupings which do not carry the ionic grouping, and these additional substituents can be varied to tailor the oxidation potential of the supersensitizer to the optimum value for use with any specific cationic electron acceptor/ sensitizing dye combination.

The counterion to the cationic supersensitizer may be any anion which is stable in the specific imaging medium used in the process, and which does not interfere with the action of any of the other components of the imaging medium. However, in order to simplify the imaging system, and to reduce the likelihood possibility of unwanted (and possibly unsuspected) interactions between the various components thereof, it is generally advantageous for the anion of the supersensitizer to be the same as that of the cationic electron acceptor. Thus, for example, when the cationic electron acceptor is any of the diaryliodonium hexafluoroantimonates mentioned in the aforementioned patents and application, or any other cationic electron acceptor having a hexafluoroantimonate anion, desirably the supersensitizer has a hexafluoroantimonate anion, while when the cationic electron acceptor has a perfluoroalkylsulfonate anion, desirably the cationic electron acceptor has the same perfluoroalkylsulfonate anion.

Specific preferred supersensitizers for use in the present process are those containing the following cations, preferably in the form of a hexafluoroantimonate or perfluoroalkylsulfonate salt:

a [3-[3-[bis[3-methylphenyl]amino]phenyl]propyl] trimethylammonium cation of the formula;

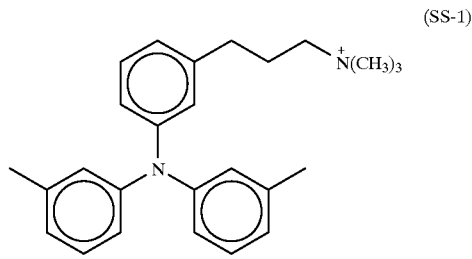

(SS-1)

a [2-[4-[diphenylamino]phenyl]methoxyethyl] trimethylammonium cation of the formula:

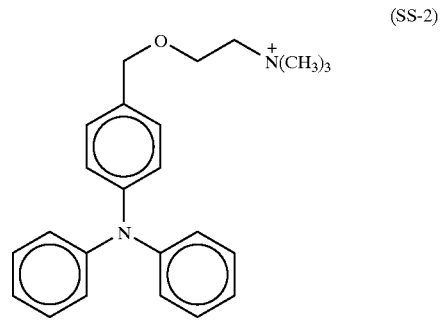

(SS-2)

a N-[4-[3-[diphenylamino]phenoxy]butoxy]pyridinium cation of the formula:

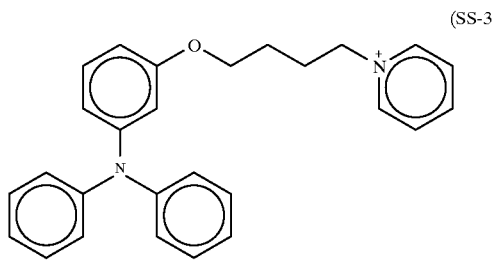
(SS-3)

a [2-[3-[diphenylamino]phenoxy]ethoxy] trimethylammonium cation of the formula:

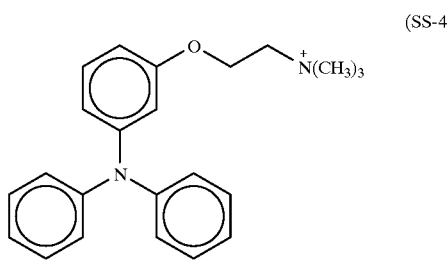
(SS-4)

a benzyldimethyl[4-[3-[diphenylamino]phenoxy]butoxy] ammonium cation of the formula:

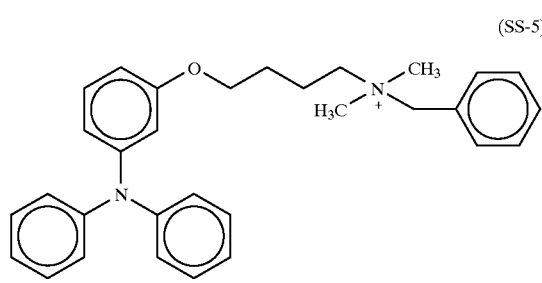
(SS-5)

a bis[2-[3-[diphenylamino]phenoxy]ethoxy] dimethylammonium cation of the formula:

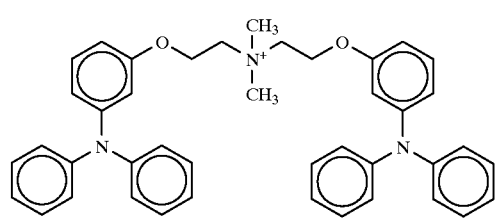
(SS-6)

a protonated dimethyl[3-[4-[bis[3-methylphenyl]amino]phenyl]propyl]ammonium cation of the formula:

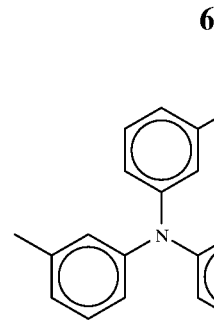
(SS-7)

a [2-[4-[bis[3-methylphenyl]amino]phenoxy]ethoxy] trimethylammonium cation of the formula:

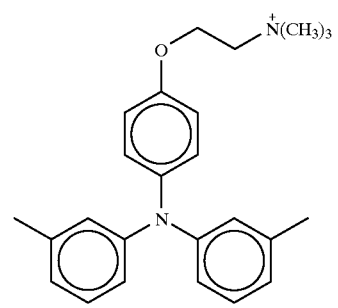
(SS-8)

a [2-[4-[bis[3-methylphenyl]amino]benzyloxy]ethoxy] trimethylammonium cation of the formula:

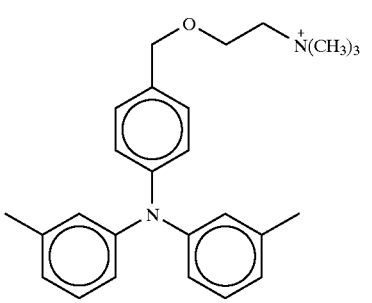
(SS-9)

a [2-[3-[bis[3-methylphenyl]amino]phenoxy]ethoxy] trimethylammonium cation of the formula:

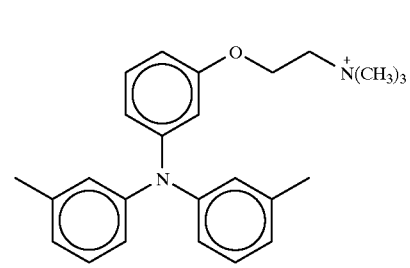
(SS-10)

a [4-[3-[diphenylamino]phenyl]but-3-enyl] trimethylammonium cation of the formula:

(SS-11)

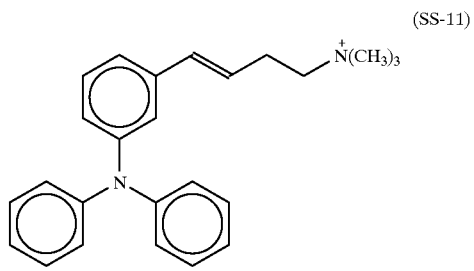

a [4-[10-[bis[3-methylphenyl]amino]phenoxydecyloxy]phenyl]-phenyliodonium cation of the formula:

(SS-12)

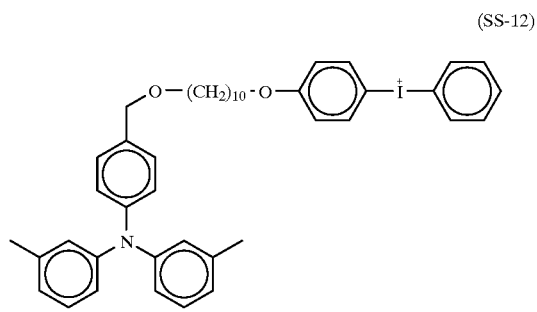

a [3-[3-[diphenylamino]phenoxy]propyl] trimethylammonium cation of the formula:

(SS-13)

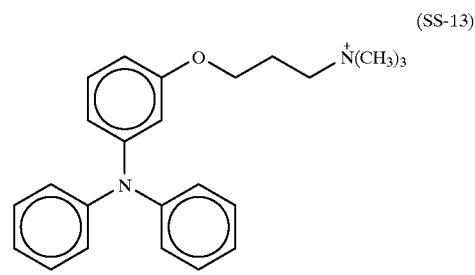

a [4-[3-[diphenylamino]phenoxy]butyl] triethylammonium cation of the formula:

(SS-14)

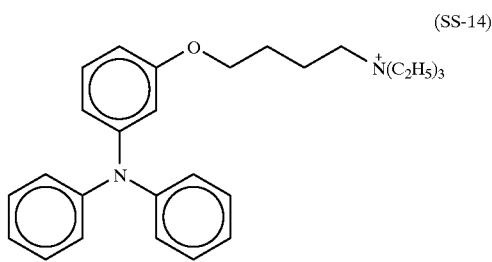

a [4-[3-[diphenylamino]phenoxy]butyl] triphenylphosphonium cation of the formula:

(SS-15)

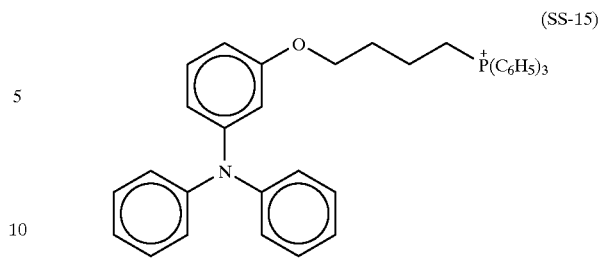

a [4-[3-[diphenylamino]phenoxy]butyl] trimethylammonium cation of the formula:

(SS-16)

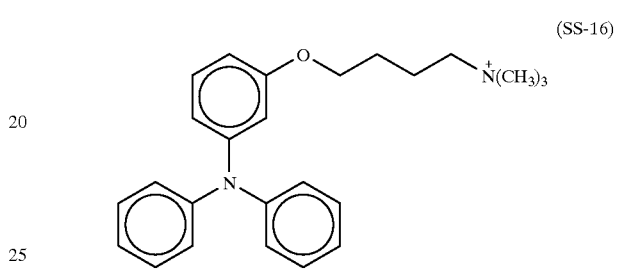

Processes for the synthesis of triphenylamines and other triarylamines are well known to those skilled in the art of organic synthesis, and various possible synthetic routes are illustrated in the Examples below. Accordingly, it is believed that skilled chemists will not experience any difficulties in preparing the preferred ionic supersensitizers for use in the present process.

As already mentioned, the use of the ionic supersensitizers in the present process and medium increases the sensitivity of the medium, as compared with similar media using non-ionic supersensitizers. The sensitivity of such media tends to increase with supersensitizer concentration (until some limit is reached at which increase in supersensitizer concentration gives little or no further increase in sensitivity) regardless of the type of supersensitizer used, and it has been found that the ionic supersensitizers may also be used to maintain the sensitivity of a specific medium while reducing the amount of supersensitizer required; reducing the amount of supersensitizer in this manner may be useful, for example when difficulties are encountered in maintaining compatibility of the various components of the imaging medium.

The cationic electron acceptor used in the present process and medium is desirably a phosphonium, sulfonium, diazonium or iodonium salt, with the latter being especially desirable. Especially preferred iodonium salts are diaryliodonium salts, especially diphenyliodonium salts, and specifically diphenyliodonium hexafluorophosphate and hexafluoroantimonate, (4-octyloxyphenyl)phenyliodonium hexafluorophosphate and hexafluoroantimonate, bis(n-dodecylphenyl)iodonium hexafluoroantimonate and (4-(2-hydroxytetradecan-1-yloxy)phenyl)phenyl iodonium hexafluoroantimonate. Other cationic electron acceptors which may be useful include the hexafluoroarsenates, tetrafluoroborates, and perfluoroalkane sulfonates of the aforementioned cations.

One preferred form of the present process is that described in the aforementioned U.S. Pat. No. 5,631,118; in this form of the process, the sensitizing dye has a first form and a second form, the first form having substantially greater substantial absorption than the second form at the wavelength used to expose the acid-generating composition, the exposure of the acid-generating composition to the radiation is effected while at least part of the sensitizing dye is in its first form, and after the exposure, in at least the parts of the acid-generating composition not exposed to the radiation, the sensitizing dye is converted to its second form, typically by deprotonation with a base or by reaction with a nucleophile. Preferred sensitizing dyes for use in this type of process include fluoran dyes, phthalide dyes, xanthene dyes, acridine dyes, and dyes of the formulae:

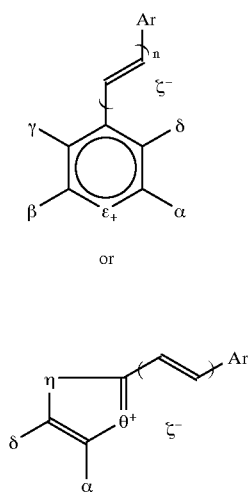

wherein:

α and δ are each a hydrogen atom or an organic group in which a carbon atom is directly bonded to the ring carrying the groups α and δ, or α and δ together comprise the atoms necessary to complete a substituted or unsubstituted benzene ring;

β, and γ are each a hydrogen atom or an organic group in which a carbon atom is directly bonded to the ring carrying the groups β and γ, or β and γ together comprise the atoms necessary to complete a substituted or unsubstituted benzene ring;

ε is a oxygen, sulfur or selenium atom, or is an N—$R^a$ group, in which $R^a$ is a hydrogen atom, an alkyl group containing from about 1 to about 20 carbon atoms, or an aryl group;

ζ is an anion;

η is a $CR^cR^d$ group, a $CR^c$=$CR^d$ group, an oxygen or sulfur atom, or an N—$R^b$ group;

θ is an oxygen, sulfur or selenium atom, or is an N—$R^a$ group;

$R^a$ is a hydrogen atom, an alkyl group containing from about 1 to about 20 carbon atoms, and optionally bearing a protonated heteroatom substituent, or an aryl group;

$R^b$ is an alkyl group containing from about 1 to about 20 carbon atoms, or an aryl group;

$R^c$ and $R^d$ are each independently a hydrogen atom, an alkyl group containing from about 1 to about 20 carbon atoms or an aryl group;

n is 0, 1, 2 or 3; and

Ar is an aryl or heterocyclic group.

The groups α, β, γ and δ may be, for example:

a. an alkyl group, for example an isopropyl, sec-butyl, tert-butyl, 2-ethyl-2-methylbutyl or 2,2-dimethylbutyl group;

b. an alkenyl group, for example a vinyl group;

c. an alkynyl group, for example an ethyne group;

d. a cycloalkyl group, for example a cyclohexyl group;

e. a cycloalkenyl group, for example a cyclohexenyl group;

f. a polycyclic saturated hydrocarbon group, for example a decalinyl or adamantyl group;

g. a polycyclic, ethylenically unsaturated hydrocarbon group, for example a 6,6-dimethylbicyclo[3.1.1]hept-2-en-2-yl or bicyclo[2.2.1]hept-2-en-5-yl group;

h. an aryl group, for example a phenyl ring; or i. any of the foregoing substituents substituted with aryl, halo, cyano, amino or oxo groups, or containing ether, amine or urethane linkages.

Sensitizing dyes suitable for use in this type of process in which the conversion of the sensitizing dye to its second form is effected by deprotonation (hereinafter called for convenience "the deprotonation process") are the fluoran, phthalide, xanthene and acridine dyes, and those of Formula I above in which ε is an N—$R^a$ grouping and $R^a$ is a hydrogen atom, and those of Formula II above in which θ is an N—$R^a$ grouping, in which $R^a$ is a hydrogen atom or an alkyl group bearing a protonated heteroatom, for example a hydroxyl group. The remaining dyes of Formulae I and II are suitable for use in this type of process in which the conversion of the sensitizing dye to its second form is effected by a nucleophile (hereinafter called for convenience "the nucleophile process").

Specific pyridinium dyes of Formula I which have been found useful in the present invention are the hexafluoroantimonate salts of the protonated forms of:

2,4,6-tris(4-methoxyphenyl)pyridine;
2,6-bis(4-methoxyphenyl)-4-(2-thienyl)pyridine;
2,6-bis(4-methoxyphenyl)-4-(2-(4-bromophenyl))pyridine;
2,6-bis(4-methoxyphenyl)-4-(2-naphthyl)pyridine;
2,4-bis(4-methoxyphenyl)-6-(2-naphthyl)pyridine;
2,4,6-tris(2,4,6-trimethoxyphenyl)pyridine; and
2,6-bis(4-methoxyphenyl)-4-(2-(1,4-dimethoxy)naphthyl) pyridine;
2,4,6-tris(2,4-dimethoxyphenyl)pyridine;
2-(2,4-dimethoxyphenyl)-4-(4-diphenylamino)-6-phenylpyridine;
2-(2,4-dimethoxyphenyl)-4-(4-diphenylamino)-6-methylpyridine; and
4-(9-ethylcarbazol-3-yl)-2,6-bis(4-methoxyphenyl) pyridine.

A useful quinolinium dye is the protonated form of 2-[2-[2,4bis[octyloxy]phenyl]ethen-1-yl]quinoline (the unprotonated form of this dye is available from Yamada Chemical Co., Kyoto, Japan), while a useful xanthene dye is the protonated form of 3',6'-bis[N-[2-chlorophenyl]-N-methylamino]spiro[2-butyl-1,1-dioxo[1,2-benzisothiazole-3(3H),9'-(9H)xanthene]] (which may be prepared as described in U. S. Pat. No. 4,345,017).

Other dyes useful in the deprotonation process of the present invention are 2-[2-[9-ethylcarbazol-3-yl]ethen-1-yl]-1-[2-hydroxyethyl]-3,3-dimethyl-3H-indolium hexafluoroantimonate; and 5-bromo-2-[2-[9-ethylcarbazol-3-yl]ethen-1-yl]-1-[2-hydroxyethyl]-3,3-dimethyl-3H-indolium hexafluoroantimonate.

Specific preferred sensitizing dyes which have been found useful in the nucleophile process include:

1-methyl-2-[2-[2,4-bis[octyloxy]phenyl]ethen-1-yl] quinolinium hexafluoroantimonate;
1-methyl-2-[2-[4-diphenylaminophenyl]ethen-1-yl] quinolinium hexafluoroantimonate;

1,3,3-trimethyl-2-[2-[9-phenylcarbazol-3-yl]ethen-1-yl]-3H-indolium hexafluoroantimonate;

1,3,3-trimethyl-2-[2-[9-ethylcarbazol-3-yl]ethen-1-yl]-3H-indolium hexafluoroantimonate;

2,6-di-t-butyl-4-(2-(9-phenylcarbazol-3-yl)ethen-1-yl) pyrylium hexafluoroantimonate; and 6-(but-2-oxy)-2-(1,1-dimethyleth-1-yl)-4-(2-(9-phenylcarbazol-3-yl)ethen-1-yl)benz[b]pyrylium hexafluoroantimonate.

Also, the prior art describes various combinations of nucleophiles and dyes which can be used in the nucleophile process of the present invention; see, for example, U.S. Pat. Nos. 5,258,274 and 5,314,795 (although note that in the present process the imaging medium may contain the nucleophile itself rather than a nucleophile-generating species as in these patents, since the nucleophile can be kept in a layer or phase separate from the acid-generating layer until the final heating step when the nucleophile converts the sensitizing dye to its second form). The nucleophile used in the present process may be a neutral molecule, for example a primary or secondary amine, a stabilized carbanion, for example a carbanion derived from a malonate ester or a nitroalkane, or a charged nucleophile, for example a thiolate.

The anion of the dye should be chosen with care having regard to the primary acid which will be generated during the imaging process. For example, it is inadvisable to use iodide, or another anion derived from a weak acid, as the anion of the dye, since the presence of such an anion in the acid-generating layer during imaging will cause the primary acid generated from the cationic electron acceptor to protonate the anion, thus leading to the formation of HI, or an acid which is similarly weak in a polymeric medium of low dielectric constant (such as those typically used in the imaging media of the present invention). Such a weak acid cannot effectively protonate the secondary acid generator, and thus does not initiate the acid amplification process. Conveniently, the anion of the sensitizing dye is chosen to be the same as that of the cationic electron acceptor; thus, for example, when the preferred cationic electron acceptor diphenyliodonium hexafluoroantimonate is used, the anion is conveniently hexafluoroantimonate.

Methods for the preparation of the aforementioned pyridinium dyes are described in the literature. One convenient method for the preparation of such dyes bearing identical substituents at the 2- and 6-positions is described in Weiss, J. Am. Chem. Soc., 74, 200 (1952) and comprises heating a mixture of an acetophenone, an aldehyde (that containing the desired 4-substituent) and ammonium acetate in acetic acid. A dihydropyridine is produced as the penultimate intermediate, but is oxidized to the pyridine by the intermediate chalcone. A second method is similar to the first, but uses hydroxylamine or unsymmetrical dimethylhydrazine in place of ammonium acetate; the penultimate intermediate in these cases are the N-hydroxydihydropyridine or N,N-dimethylaminodihydropyridine, which undergo elimination and aromatization without the need for an oxidizing agent. A third method, described in Krohnke, Synthesis, 1976, 1, can produce asymmetric pyridinium dyes. In this third method, an aryl aldehyde containing the desired 4 substituent and an acetophenone containing the desired 2-substituent are reacted to form an intermediate chalcone, which is then reacted with the phenacylpyridinium salt derived from the acetophenone containing the desired 6-substituent. The resultant pyridinium-substituted dihydropyridine undergoes loss of pyridine with aromatization.

The acid generated from the cationic electron acceptor by the present process may be used directly to carry out any reaction for which such acids have hitherto been used; for example, the acid could be used to bring about cationic polymerization of a monomer or oligomer, or modification (for example, crosslinking, deprotection or depolymerization) of a polymer, thereby providing a photoresist system. However, as discussed in most of the patents and application mentioned in the introductory section of this application, in preferred forms of the present process the acid-generating composition further comprises a secondary acid generator capable of thermal decomposition to form a secondary acid, the thermal decomposition of the secondary acid generator being catalyzed by the primary acid generated from the cationic electron acceptor, and, after the exposure of the acid-generating composition to the electromagnetic radiation, the acid-generating composition is heated, thereby causing, in the parts of the acid-generating composition exposed to the radiation, acid-catalyzed decomposition of the secondary acid generator and generation of the secondary acid.

Although any of the secondary acid generators described in the patents and application mentioned in the introductory section of this application may be used in the present process, advantageously, the secondary acid generator is more basic than the sensitizing dye and the supersensitizer, so that the primary acid produced by decomposition of the cationic electron acceptor will protonate the secondary acid generator rather than the sensitizing dye or the supersensitizer. Preferably, the secondary acid generator is selected from those described in the aforementioned applications Ser. Nos. 08/757,195 and 08/944,284. These secondary acid generators have a first site bearing a first leaving group and a second site bearing a second leaving group, the first leaving group being capable of protonation by the primary acid, with expulsion of the first leaving group to form a cation, followed by:

(i) loss of a proton from the cation to form an unstable intermediate, which then fragments with loss of the second leaving group, accompanied by either (a) loss of a second proton; or (b) addition of a proton-containing nucleophile, followed by loss of a proton; or (ii) electrophilic addition of the cation to an unsaturated reagent bearing a proton at the site of addition and a proton-containing nucleophilic grouping at an adjacent site, following which the proton at the site of the addition is lost and the second leaving group is displaced by the nucleophilic grouping.

In all cases, the second leaving group, in combination with a proton, forms the secondary acid. Desirably, the secondary acid is capable of protonating the first leaving group of the secondary acid generator so that the acid-catalyzed thermal decomposition of the secondary acid generator is autocatalytic.

As discussed in the aforementioned applications Ser. Nos. 08/757,195 and 08/944,284, skilled chemists will appreciate that the use of a secondary acid generator having two separate active sites allows an additional degree of freedom in controlling the properties of the secondary acid generator. In particular, the first leaving group can be chosen to be relatively basic, so as to be readily protonated, while the second leaving group can be chosen to produce a strong secondary acid. For example, the first leaving group can be a hydroxyl group, which is readily protonated and then lost as water (which is essentially non-acidic, at least in the polymeric media in which the present process is typically carried out), while the second leaving group can be a tosyloxy group, which produces p-toluenesulfonic acid as the secondary acid, this being a much more powerful acid than the squaric and oxalic acid derivatives produced by the prior art processes discussed above.

The two steps in the decomposition of the secondary acid generator (i.e., the loss of the first leaving group, and the loss of the second leaving group) will of course normally proceed at different rates. Although the present invention is not limited to any particular relationship between these rates, in general it is desirable that the second step be slower than the first. If the second step is relatively slow, and minor amounts of thermal decomposition of the primary acid generator occur during storage, such thermal decomposition will not necessarily cause generation of secondary acid from the secondary acid generator, and subsequent catalyzed breakdown of more secondary acid generator molecules.

By appropriate choice of the first and second leaving groups, the secondary acid can be made sufficiently strong to be capable of protonating the first leaving group of the secondary acid generator. In such cases, the thermal decomposition of the secondary acid generator is catalyzed not only by the primary acid but also by the secondary acid itself, i.e., the thermal decomposition is autocatalytic. Thus, the first few molecules of secondary acid generated from a single molecule of the primary acid can in turn catalyze the decomposition of additional molecules of secondary acid generator to produce additional secondary acid, thereby providing a "cascade reaction" which increases the number of moles of secondary acid generated from a single mole of primary acid, and thereby enhances the sensitivity of the process.

In general, preferred first leaving groups for the secondary acid generators are those comprising a nitrogen, phosphorus, sulfur or oxygen atom bonded directly to the first site, this first leaving group having a $pK_{HA+}$ greater than about –6. Examples of such first leaving groups include hydroxy, alkoxy, amino, alkylamino, acyloxy, aroyloxy, acylamino, aroylamino, carbamate and 2-oxopyridyl groups, and groups of the formula —O—C(=O)—C(=O)—O—R$^4$, wherein R$^4$ is an alkyl or aryl group. Preferred second leaving groups are neutral groups having the $pK_{HA}$ of their conjugate acids not greater than about 2, or cationic groups having the $pK_{HA+}$ of their conjugate acids not greater than about 2. The first and second leaving groups may both be attached to a carbocyclic ring containing from 5 to 8 carbon atoms; this carbocyclic ring may be fused to an alicyclic or aromatic ring.

More specifically, a first preferred group of secondary acid generators for use in the present process are 1,2-diol derivatives of the formula:

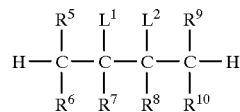
(III)

or of the formula:

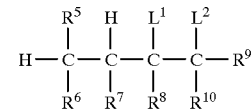
(IV)

wherein L$^1$ is the first leaving group, L$^2$ is the second leaving group, and R$^5$, R$^6$, R$^7$, R$^8$, R$^9$ and R$^{10}$ are each independently a hydrogen atom, an alkyl, cycloalkyl, aralkyl or aryl group, subject to the proviso that any two of R$^5$, R$^6$, R$^7$, R$^8$, R$^9$ and R$^{10}$ may, together with the carbon atom(s) to which they are attached, form a carbocyclic ring. Among the secondary acid generators of Formulae III and IV, an especially preferred subgroup are those of the formula:

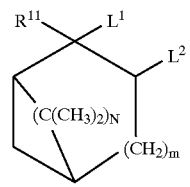
(V)

wherein L$^1$ and L$^2$ are as defined above with reference to Formulae III and IV, R$^{11}$ is an aryl or alkyl group; m is 0, 1, 2 or 3; and N is 0 or 1, subject to the proviso that, when L$^1$ is a hydroxyl group, L$^1$ and L$^2$ are in the cis orientation to one another. Preferred compounds of Formula V are those in which L$^1$ comprises a nitrogen, phosphorus, sulfur or oxygen atom bonded directly to the cyclohexane ring, the group L$^1$ having a $pK_{HA+}$ greater than about –6; and L$^2$ comprises a halo, sulfonium, sulfonate, sulfate, sulfamate or phosphate ester group, especially those in which R$^{11}$ is an aryl group, optionally substituted with at least one halo, alkyl, nitro, alkoxy or aryloxy substituent, or is an alkyl group containing not more than about 6 carbon atoms; L$^1$ is of the formula OR$^{12}$ wherein R$^{12}$ is a hydrogen atom or an acyl group, or a group of the formula —C(=O)—C(=O)—O—R$^{13}$, in which R$^{13}$ is an alkyl or aryl group; L$^2$ is of the formula —OSO$_2$R$^{14}$, wherein R$^{14}$ is an aryl group, optionally substituted with at least one halo, alkyl, nitro, alkoxy or aryloxy substituent, or is an alkyl group containing not more than about 12 carbon atoms, which may be substituted with an alicyclic group, this alicyclic group optionally bearing an oxo group, or L$^2$ is a diarylphosphate ester group or an N,N-disubstituted sulfamate group wherein each of the substituents independently is an alkyl or aryl group; and m is 0 or 1. Specific preferred secondary acid generators of Formula V are those in which:

(a) R$^{11}$ is a phenyl group, L$^1$ is a hydroxyl group and L$^2$ is a tosyl group; or (b) R$^{11}$ is a p-chlorophenyl, p-methylphenyl, p-phenoxyphenyl or p-methoxyphenyl group, L$^1$ is a hydroxyl group and L$^2$ is a methylsulfonyl group.

Another especially preferred subgroup of the secondary acid generators of Formula III and IV are those of the formula:

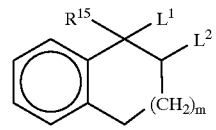
(VI)

wherein L$^1$ and L$^2$ are as defined above with reference to Formulae III and IV, R$^{15}$ is an aryl or alkyl group; and m is 0, 1, 2 or 3, subject to the proviso that, when L$^1$ is a hydroxyl group, L$^1$ and L$^2$ are in the cis orientation to one another.

As will be apparent to skilled chemists, the compounds of Formula V and VI exist in optical isomers, since the carbon atom bearing the groups R$^{11}$ (or R$^{15}$) and L$^1$ is an asymmetric center, as is the carbon atom bearing the group L$^2$. Accordingly, the compounds of Formulae V and VI exist in two diastereomeric forms. As already noted, when $L^1$ is a hydroxyl group (and in some cases when $L^1$ is an amino group), the groups $L^1$ and $L^2$ should be in the cis orientation to one another; it does not matter which enantiomer, or mixture of enantiomers is used.

Preferred compounds of Formula VI are those in which $L^1$ comprises a nitrogen, phosphorus, sulfur or oxygen atom bonded directly to the cyclohexane ring, the group $L^1$ having a $pK_{HA+}$ greater than about −6; and $L^2$ comprises a halo, sulfonium, sulfonate, sulfate, sulfamate or phosphate ester group, especially those in which $R^{15}$ is an aryl group, optionally substituted with at least one halo, alkyl, nitro, alkoxy or aryloxy substituent, or is an alkyl group containing not more than about 6 carbon atoms; $L^1$ is of the formula $OR^{16}$ wherein $R^{16}$ is a hydrogen atom or an acyl group, or a group of the formula —C(=O)—C(=O)—O—$R^{17}$, in which $R^{17}$ is an alkyl or aryl group; $L^2$ is of the formula —$OSO_2R^{18}$, wherein $R^{18}$ is an aryl group, optionally substituted with at least one halo, alkyl, nitro, alkoxy or aryloxy substituent, or is an alkyl group containing not more than about 12 carbon atoms, which may be substituted with an alicyclic group, this alicyclic group optionally bearing an oxo group, or $L^2$ is a diarylphosphate ester group or an N,N-disubstituted sulfamate group wherein each of the substituents independently is an alkyl or aryl group; and m is 0 or 1. Specific preferred secondary acid generators of Formula VI are those in which $R^{15}$ is a methyl group, $L^1$ is a hydroxyl group and $L^2$ is a p-methylphenylsulfonyl, p-n-butylphenylsulfonyl, p-n-octylphenylsulfonyl group, (7,7-dimethylbicyclo[2.2.1]heptan-2-onyl)methylsulfonyl or N,N-dimethylsulfamate group.

Another preferred group of secondary acid generators for use in the present process are 1,3-diol derivatives of the formula:

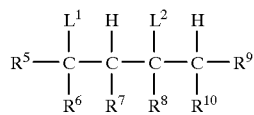

(VII)

or of the formula:

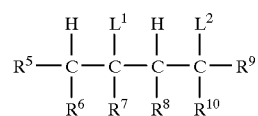

(VIII)

wherein $L^1$ is the first leaving group, $L^2$ is the second leaving group, and $R^5$, $R^6$, $R^70$, $R^8$, $R^9$ and $R^{10}$ are each independently a hydrogen atom, an alkyl, cycloalkyl, aralkyl or aryl group, subject to the proviso that any two of $R^5$, $R^6$, $R^7$, $R^8$, $R^9$ and $R^{10}$ may, together with the carbon atom(s) to which they are attached, form a carbocyclic ring and that this carbocyclic ring may optionally be substituted with an additional second leaving group $L^2$.

An especially preferred subgroup of the secondary acid generators of Formulae VII and VIII are those of the formula:

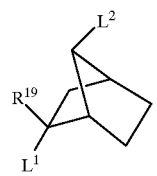

(IX)

wherein $L^1$ is the first leaving group, $L^2$ is the second leaving group and $R^{19}$ is a carbonium ion stabilizing group. Preferred compounds of Formula IX are those in which $L^1$ comprises a nitrogen, phosphorus, sulfur or oxygen atom bonded directly to the cyclohexane ring, the group $L^1$ having a $pK_{HA+}$ greater than about −6; $L^2$ comprises a halo, sulfonium, sulfonate, sulfate, sulfamate or phosphate ester group; and $R^{19}$ is an alkyl, cycloalkyl, aralkyl or aryl group. Desirably $L^1$ is a hydroxy, alkoxy, amino, alkylamino, acyloxy, aroyloxy, acylamino, aroylamino, carbamate and 2-oxopyridyl group or a group of the formula —O—C(=O)—C(=O)—O— $R^{20}$, wherein $R^{20}$ is an alkyl or aryl group; and $L^2$ is a group of the formula —$OSO_2R^{21}$ or —$S^+(R^{21})_2$ X— (wherein each $R^{21}$ is an aryl group, which may be substituted with at least one halo, alkyl, nitro, alkoxy or aryloxy substituent, or is an alkyl group containing not more than about 12 carbon atoms, which may be substituted with an alicyclic group, this alicyclic group optionally bearing an oxo group, subject to the proviso that when more than one group $R^{21}$ is present, these groups $R^{21}$ may be the same or different), and X is an anion, or $L^2$ is a diarylphosphate ester group or an N,N-disubstituted sulfamate group wherein each of the substituents independently is an alkyl or aryl group. Specific preferred secondary acid generators of this type are those in which $L^1$ is a hydroxyl group, $L^2$ is a tosyloxy group and $R^{19}$ is a 3,5-dichlorophenyl, 4-trifluoromethylphenyl, 4-chlorophenyl, 3-chlorophenyl, phenyl or 4-methylphenyl group.

Methods for the synthesis of each of the aforementioned preferred groups of secondary acid generators are described in the aforementioned applications Ser. Nos. 08/757,195 and 08/944,284, as are the reactions occurring during the acid-catalyzed thermal decomposition of certain preferred secondary acid generators.

The secondary acid generators may have multiple second leaving groups. In certain structures, the departure of a "primary" second leaving group adjacent the first leaving group may cause a change in structure of the secondary acid generator (for example, the formation of a C=C double bond) which destabilizes a "secondary" second leaving group more remote from the first leaving group, thereby triggering departure of this secondary second leaving group, with formation of a second molecule of the secondary acid. Obviously, the departure of the secondary second leaving group may cause a similar change in structure further along the molecule, thereby destabilizing a "tertiary" second leaving group, with formation of a third molecule of the secondary acid. The use of secondary acid generators containing multiple second leaving groups may be advantageous because protonation of only one first site on the secondary acid generator is required to cause departure of multiple second leaving groups, thereby increasing the number of protons generated from each protonation and increasing the "amplification factor" (i.e., the number of moles of secondary acid generated from each mole of primary acid) of the secondary acid generator.

As already mentioned, the second step in the decomposition of the secondary acid generator may involve, in addition to the loss of the second leaving group, either loss of a second proton or addition of proton-containing nucleophile to the secondary acid generator, followed by loss of a proton. Where the second leaving group comprises a phosphate ester, it is desirable to have a nucleophile present with or adjacent the secondary acid generator so that the second step can proceed by the latter route; appropriate nucleophiles include phenols (especially resorcinol), thiophenols, thiols and phosphines. The nucleophile may be provided either in the same layer as the secondary acid generator or be introduced later, normally by diffusion from an adjacent layer; later introduction is preferred since there is less risk of unintentional acid generation during storage of the medium.

Whatever type of secondary acid generator is used, in a preferred form of the present process, after the secondary acid has been generated, this secondary acid contacts an acid-sensitive material capable of undergoing a color change in the presence of the secondary acid, thereby causing a color change in the parts of the acid-generating composition exposed to the radiation. Essentially any indicator dye can be used as the acid-sensitive material, provided that it is compatible with the other components of the imaging medium, and numerous examples of suitable indicator dyes are given in the aforementioned patents and application, and in the Examples below.

Imaging media of this invention still contain, after imaging, a substantial amount of unchanged cationic electron acceptor, and are thus susceptible to post-imaging color changes caused by unwanted generation of acid by ambient radiation striking the cationic electron acceptor. However, this susceptibility of the imaged media to unwanted color generation can be eliminated by including in the media a "fixing" reagent capable of destroying the cationic electron acceptor, thus fixing the image. Fixing reagents capable of fixing media containing cationic electron acceptors, and processes for their use, are described and claimed in the aforementioned U.S. Pat. No. 5,582,956 and copending application Ser. No. 08/232,757, now U.S. Pat. No. 5,441,850. The preferred embodiment of the invention described below with reference to Table 1 and the accompanying drawings contains such a fixing reagent.

Imaging media of the present invention which make use of a secondary acid generator and an indicator dye will typically comprise two layers, namely an acid-generating layer containing the cationic electron acceptor, sensitizing dye, supersensitizer and the secondary acid generator, and a second layer comprising the indicator dye, and any fixing or other reagents needed in the particular system used, for example any nucleophile required for conversion of the sensitizing dye to its second, essentially non-absorbing form. Typically, each of the two layers will also contain a polymeric binder; usually these layers are formed by combining the active materials and the binder in a common solvent, applying a layer of the coating composition to the support and then drying. Rather than a solution coating, the layer may be applied as a dispersion or an emulsion. The coating composition also may contain dispersing agents, plasticizers, defoaming agents, coating aids and materials such as waxes to prevent sticking. The glass transition temperature and chemical natures of the binders should be chosen to permit intermixing of the components of the acid-generating and color-change layers during the heating step of the process.

The binder used for an acid-generating layer must of course be sufficiently non-basic that the primary acid generated during the present process is not buffered by the binder. Examples of binders that may be used include styreneacrylonitrile copolymers, polystyrene, poly($\alpha$-methylstyrene), copolymers of styrene and butadiene, poly (methyl methacrylate), copolymers of methyl and ethyl acrylate, poly(vinyl butyral), polycarbonate, poly (vinylidene chloride) and poly(vinyl chloride). It will be appreciated that the binder selected should not have any adverse effect on the cationic electron acceptor, sensitizing dye, supersensitizer, secondary acid generator, fixing reagent (if any) or image dye (if any) incorporated therein. Also, the binder should be heat-stable at the temperatures encountered during the heating step and should be transparent so that it does not interfere with viewing of the image. The binder must of course transmit the actinic radiation used in the exposure step(s), and should also be chosen so that it does not retain any significant amount of water. As chemists are well aware, the most powerful acidic species that can exist in the presence of more than one equivalent of water is the hydroxonium (hydronium) ion, $[H_3O]^+$. Accordingly, if the medium in which the decomposition of a cationic electron acceptor is conducted contains water, at least part of the acid produced from the cationic electron acceptor will simply generate hydroxonium ion. However, in the absence of water, the decomposition yields an acidic species much stronger than hydroxonium ion, and this acidic species can effect the acid-catalyzed decomposition of various secondary acid generators which hydroxonium ion cannot. Appropriate binders can readily be chosen to provide an essentially anhydrous environment for the present process.

In addition to the acid-generating and color-change layers, imaging media of the present invention may also comprise a support and additional layers, for example, a subbing layer to improve adhesion to the support, acid-impermeable interlayers for separating multiple acid-generating/color-change bilayers from one another (in a full color medium), an anti-abrasive topcoat layer, and other auxiliary layers.

The support employed may be transparent or opaque and may be any material that retains its dimensional stability at the temperature used for image formation. Suitable supports include paper, paper coated with a resin or pigment, such as, calcium carbonate or calcined clay, synthetic papers or plastic films, such as polyethylene, polypropylene, polycarbonate, cellulose acetate and polystyrene. The preferred material for the support is a polyester, desirably poly(ethylene terephthalate).

Figure 1B:
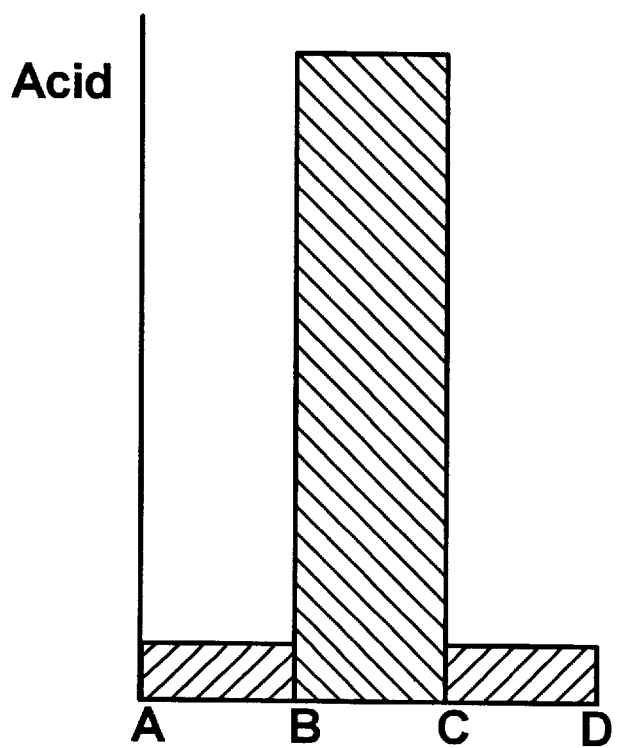
Figure 1C:
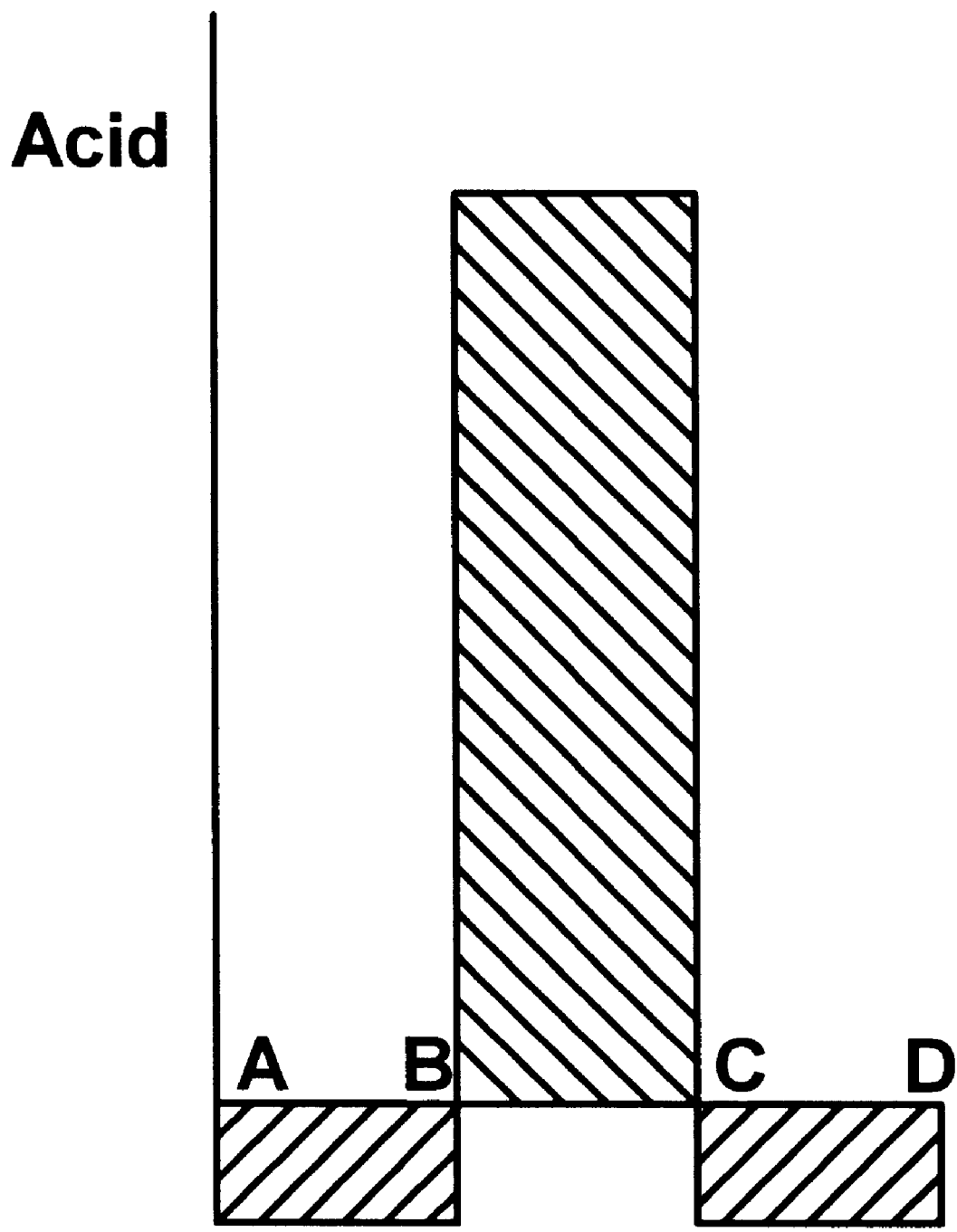

To illustrate the chemical reactions which may take place during an imaging process of the present invention, a preferred process of this type using an acid-generating layer comprising a cationic electron acceptor (an iodonium salt), a sensitizing dye, a supersensitizer, and a secondary acid generator, and a color change layer comprising an indicator dye and a fixing reagent, will now be described, with reference to Table 1 below and FIGS. 1A–1C of the accompanying drawings.

TABLE 1

| EXPOSED AREA | | NON-EXPOSED AREA | |
|---|---|---|---|
| Component | Moles | Component | Moles |
| PRIOR TO IMAGING | | | |
| Sensitizing dye | 1 | Sensitizing dye | 1 |
| Supersensitizer | 14 | Supersensitizer | 14 |
| Secondary acid generator | 41 | Secondary acid generator | 41 |
| Iodonium salt | 7 | Iodonium salt | 7 |

TABLE 1-continued

| EXPOSED AREA | | NON-EXPOSED AREA | |
|---|---|---|---|
| Component | Moles | Component | Moles |
| AFTER EXPOSURE | | | |
| Sensitizing dye | 1 | Sensitizing dye | 1 |
| Supersensitizer | 13 | Supersensitizer | 14 |
| Protonated secondary acid generator | 1 | Secondary acid generator | 41 |
| Secondary acid generator | 40 | Iodonium salt | 7 |
| Iodonium salt | 6 | | |
| AFTER HEATING | | | |
| Sensitizing dye | 1 | Sensitizing dye | 1 |
| Supersensitizer | 13 | Supersensitizer | 14 |
| Secondary acid | 41 | Secondary acid generator | 40 |
| Iodonium salt | 6 | Secondary acid | 1 |
| Primary acid | 1 | Iodonium salt | 7 |
| AFTER FIXING | | | |
| Sensitizing dye | 1 | Sensitizing dye (second form) | 1 |
| Supersensitizer | 13 | Supersensitizer | 14 |
| Decomposition products from iodonium salt | 6 | Secondary acid generator | 40 |
| Protonated image dye | 38 | Decomposition products from iodonium salt | 7 |
| Unprotonated image dye | 2 | Image dye (unprotonated) | 40 |
| Protonated base | 10 | Protonated base | 9 |
| | | Unprotonated base | 1 |

Table 1 and FIGS. 1A–1D of the accompanying drawings show the changes in acid concentration in exposed and non-exposed areas of the acid-generating layer used at various stages during the imaging process. The last section of Table 1, headed "AFTER FIXING," shows the composition of the combined acid-generating and color-change layers after the components thereof have become intermixed.

The imaging medium initially contains the sensitizing dye in its first form, which is effective to sensitize the iodonium salt used to radiation. Both the exposed and non-exposed areas comprise a quantity (shown in Table 1 as 1 mole for simplicity; all references to moles concerning Table 1 refer to moles per unit area of the imaging medium, and are only by way of illustration, since the proportions of the various components may vary widely) of the sensitizing dye, a larger molar quantity of the cationic electron acceptor (7 moles of iodonium salt are shown in Table 1) and a still larger molar quantity (41 moles are shown in Table 1) of a secondary acid generator, together with 14 moles of a supersensitizer.

The imaging medium is imagewise irradiated with radiation of a wavelength absorbed by the sensitizing dye, preferably visible radiation. For ease of illustration, it is assumed that exposed areas receive sufficient radiation to decompose 1 mole of the iodonium salt, thus producing a corresponding amount of primary acid. This acid immediately protonates 1 mole of the secondary acid generator, which is arranged to be the most basic species present in the acid-generating layer. Thus, after the exposure, as shown in Table 1, the exposed areas of the acid-generating layer contain 1 mole of protonated secondary acid generator, 40 moles of unprotonated secondary acid generator, 6 moles of unchanged iodonium salt and 13 moles of supersensitizer; 1 mole of the supersensitizer is consumed during the decomposition of the 1 mole of iodonium salt, and the decomposition products from this 1 mole of supersensitizer are ignored in Table 1 for simplicity. The unexposed areas are of course unchanged by the exposure. This situation is illustrated in FIG. 1A, which shows the 1 mole of acid present in the exposed area BC and the absence of acid in the unexposed areas AB and CD.

The imaging medium is next heated. In the exposed area BC, the primary acid, which has already protonated 1 mole of the secondary acid generator, catalyzes the decomposition of this secondary acid generator (and the secondary acid thus produced may also catalyze the decomposition of additional secondary acid generator), thus producing a large quantity of the secondary acid (41 moles are shown by way of example in Table 1, which assumes complete decomposition of the secondary acid generator; FIG. 1B is not strictly to scale). However, in the non-exposed areas AB and CD, no such primary acid is present, so that essentially no decomposition of the secondary acid generator occurs and essentially no secondary acid is generated. Depending upon the specific secondary acid generator and heating conditions employed, some uncatalyzed thermal decomposition of the secondary acid generator may take place in the non-exposed areas, and in order to illustrate that such uncatalyzed thermal decomposition does not affect the result of the present process, Table 1 and FIG. 1B assume that 1 mole of secondary acid is generated in the non-exposed areas. In practice, substantially less secondary acid would be expected in the non-exposed areas.

In the final step of the process, as discussed in more detail below, the components of the acid-generating and color change layers become intermixed. Table 1 assumes that the color-change layer contains 40 moles of an indicator image dye and 10 moles of a base, which serves to deprotonate the sensitizing dye to its second form. Table 1 further assumes that the color-change layer contains at least enough fixing reagent to ensure that all remaining iodonium salt is destroyed; residual fixing agent is ignored in Table I for clarity. In the exposed areas, the fixing reagent decomposes all remaining iodonium salt, with the generation of a further 6 moles of primary acid. Thus, each unit area of the medium now contains 48 moles of acid (the 41 moles of secondary acid and 1 mole of primary acid present after the heating step, together with the further 6 moles of acid generated by decomposition of the iodonium salt). Of this acid, 10 moles is consumed by protonating the 10 moles of base, and the remaining 38 moles are used to protonate 38 moles of image dye, thus producing color in the exposed areas, and leaving 2 moles of unprotonated image dye in these areas. Since there is no surplus base present, the sensitizing dye is not deprotonated and remains in its first form. This situation is represented in FIG. 1C, which shows the large amount of acid present after fixing. Note that although the sensitizing dye is still is its first form, the destruction of all remaining iodonium salt ensures that the exposed areas of the medium are no longer photosensitive.

In contrast, in the non-exposed areas, only 8 moles of acid are generated per unit area of the medium (the 1 mole of secondary acid from the heating step plus the 7 moles of primary acid generated by destruction of the 7 moles of iodonium salt by the fixing reagent). All 8 moles of acid are used to protonate 8 moles of the base. A further mole of base is used to deprotonate the sensitizing dye, thus converting it to its second form and removing the contribution of the first form of the sensitizing dye to the color of the medium, and thus minimizing the optical density ($D_{min}$) in the non-exposed areas. Furthermore, 1 mole of free, unprotonated base still remains, thus ensuring that should any small amount of secondary acid be generated from the remaining secondary acid generator (for example, by exposure of the medium to elevated temperatures during transportation or storage), this small amount of secondary acid will immediately be neutralized by the base, and will thus not change the $D_{min}$ of the non-exposed areas.

Figure 2:
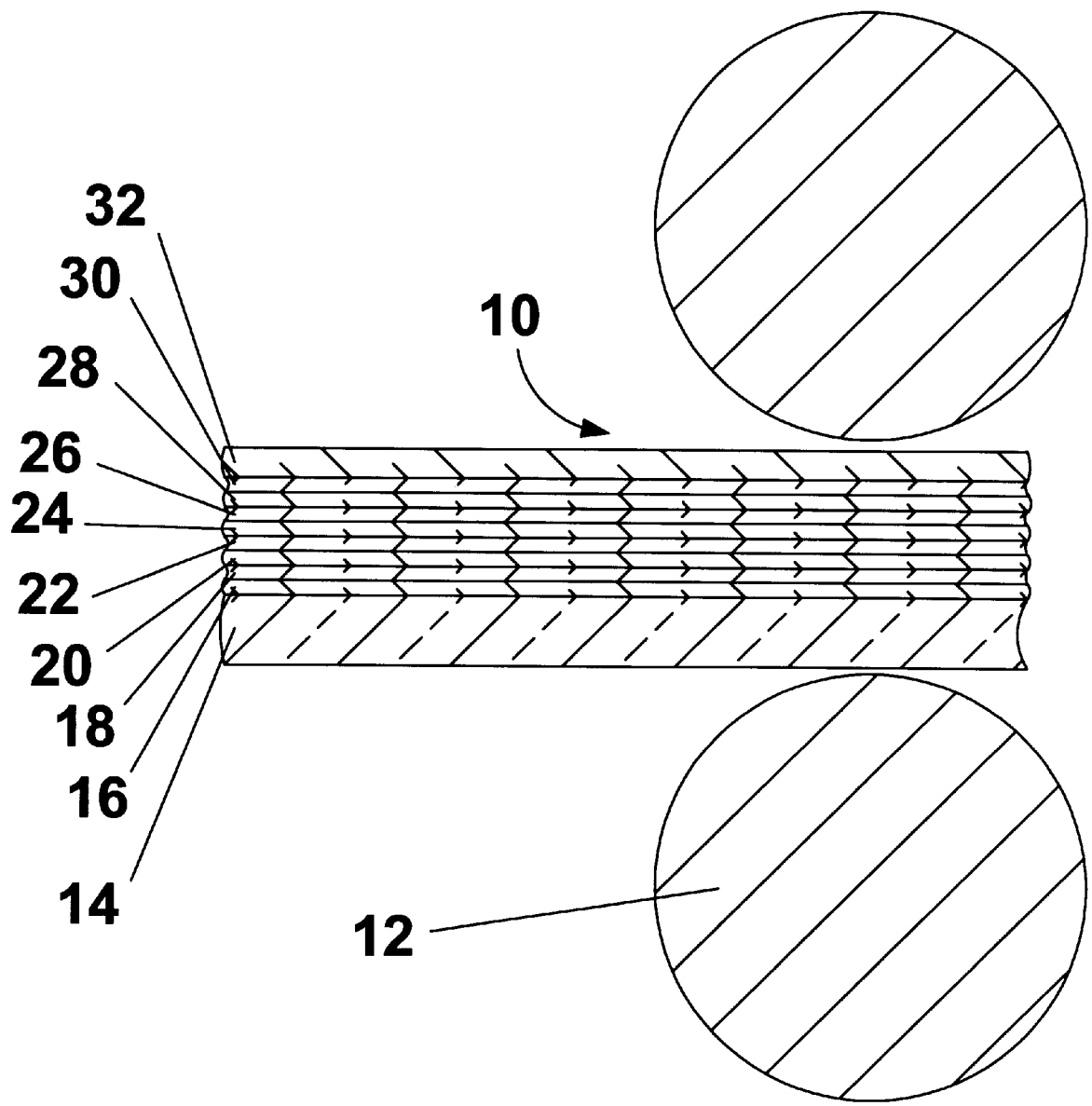
FIG. 2 is a schematic cross-section through an imaging medium of the present invention as it is being passed between a pair of hot rollers during a preferred imaging process of the present invention.

A preferred embodiment of the invention will now be described, though by way of illustration only, with reference to FIG. 2 of the accompanying drawings, which shows a schematic cross-section through a full color imaging medium (generally designated 10) of the present invention as the image therein is being fixed by being passed between a pair of hot rollers 12.

The imaging medium 10 comprises a support 14 formed from a plastic film. Typically the support 14 will comprise a polyethylene terephthalate film 3 to 10 mils (76 to 254 m$\mu$) in thickness, and its upper surface (in FIG. 2) may be treated with a sub-coat, such as are well-known to those skilled in the preparation of imaging media, to improve adhesion of the other layers to the support.

On the support 14 is disposed a first acid-generating layer 16 comprising:

(a) an iodonium salt, namely [4-[2-hydroxytetradecan-1-yloxy]phenyl]phenyliodonium hexafluoroantimonate;

(b) a nucleophilically-bleachable sensitizing dye of the formula:

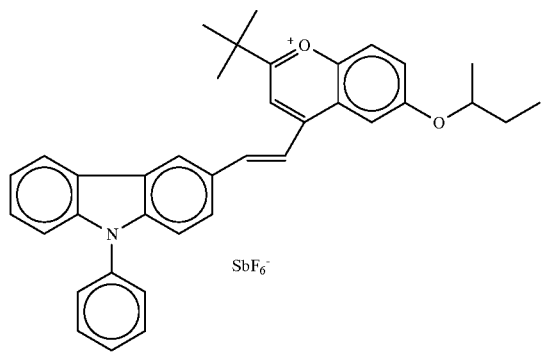

This sensitizing dye sensitizes the iodonium salt to red visible radiation;

(c) a supersensitizer, namely [3-[3-[diphenylamino]phenoxy]propyl]trimethylammonium hexafluoroantimonate;

(d) a secondary acid generator, which undergoes thermal decomposition to form a secondary acid; this secondary acid generator is of the formula:

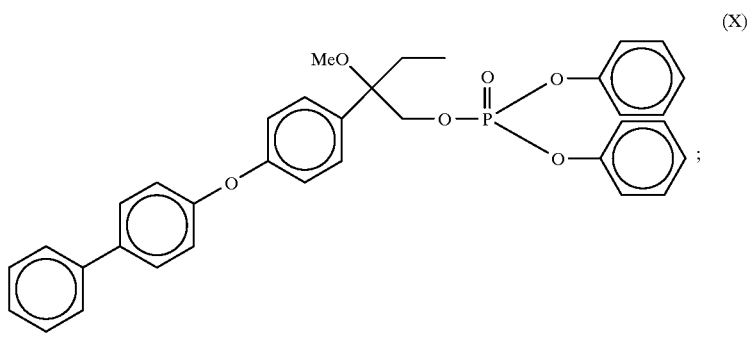

(e) a fixing agent, namely a hydroquinone; and (f) a polystyrene binder.

On the opposed side of the acid-generating layer 16 from the support 14 is disposed a first color-change layer 18 comprising:

(a) a first image dye, of the formula:

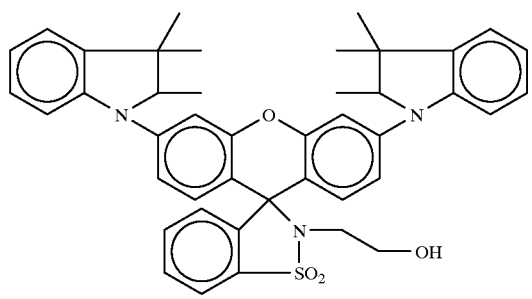

which changes from colorless to cyan in the presence of an acid;

(b) a phenolic nucleophile, namely 1,3-dihydroxy-4-dodecylbenzene (c) an amine, namely N,N'-bis(3-aminopropyl)piperazine; and (d) a binder, namely poly(2-hydroxypropyl methacrylate).

The binders used in the acid-generating layer 16 and the color-change layer 18 both have a glass transition temperature substantially above room temperature.

Superposed on the first color-change layer 18 is an acid-impermeable layer 20, which serves to prevent acid generated in the second acid-generating layer 22 (see below) during imaging penetrating to the first color-change layer 18. Superposed on the acid-impermeable layer 20 is a second acid-generating layer 22, which contains the same iodonium salt, secondary acid generator, supersensitizer and binder as the first acid-generating layer 16. However, the second acid-generating layer 22 contains, as a nucleophilically-bleachable sensitizing dye:

(X)

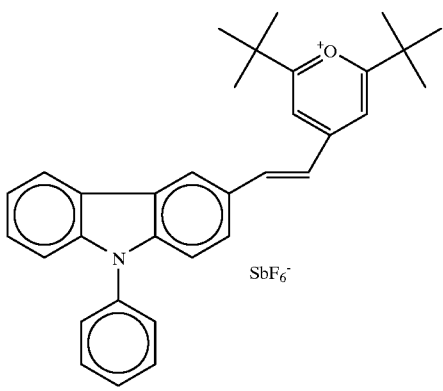

which sensitizes the iodonium salt to green visible radiation.

Superposed on the second acid-generating layer 22 is a second color-change layer 24 which is identical to the first color-change layer, except that the image dye previously described is replaced by a second image dye, of the formula:

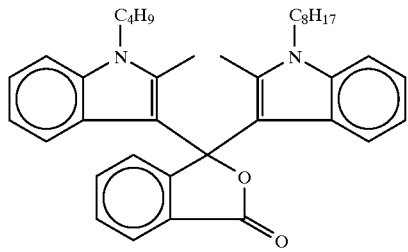

(available from Hilton Davis Co., 2235 Langdon Farm Road, Cincinnati, Ohio 45237 under the tradename "Copikem 35"), which changes from colorless to magenta in the presence of an acid.

The next layer of the imaging medium is a second acid-impermeable interlayer 26, identical to the layer 20. Superposed on the acid-impermeable layer 26 is a third acid-generating layer 28, which contains the same iodonium salt, secondary acid generator, supersensitizer and binder as the first and second acid-generating layers 16 and 22 respectively. However, this third acid-generating layer 28 contains an indicator sensitizing dye of the formula:

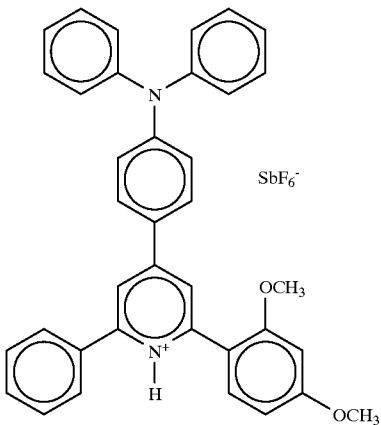

which sensitizes the iodonium salt to blue visible radiation. Superposed on the third acid-generating layer 28 is a third color-change layer 30 which is identical to the first color-change layer, except that the image dye is the free base form of the sensitizing dye used in the third acid-generating layer; this image dye changes from colorless to yellow in the presence of an acid. Finally, the imaging medium 10 comprises an abrasion-resistant topcoat 32.

The imaging medium 10 is exposed by writing on selected areas of the medium with three radiation sources having wavelengths in the red, green and blue visible regions respectively. The three radiation sources may be applied simultaneously or sequentially; for example, the medium may be scanned in a raster pattern in any known manner for example (a) simultaneously by the focused beams from three lasers of appropriate wavelengths; (b) sequentially through three masks to radiation from lamps generating radiation of appropriate wavelengths; or (c) simultaneously through a three-color mask to appropriately-filtered radiation from a lamp (thus, this medium is useful for making photographic prints from negatives). The red radiation, which carries the cyan channel of the desired image, images the first acid-generating layer 16, the green radiation, which carries the magenta channel, images the second acid-generating layer 22 and the blue radiation, which carries the yellow channel, images the third acid-generating layer 28. Thus, as described above with reference to FIGS. 1A–1C, since the sensitizing dyes in the three acid-generating layers 16, 22 and 28 are present in their first (i.e., strongly absorbing) form, latent images in acid are formed in the acid-generating layers 16, 22 and 28.

The imaging medium 10 is passed between the heated rollers 12; the heat applied by these rollers causes the acid present in the exposed areas of the acid-generating layers 16, 22 and 28 to cause catalytic breakdown of the secondary acid generator therein, thus causing formation of a quantity of secondary acid substantially greater than the quantity of acid generated by the imagewise exposures. The secondary acid thus produced also catalyzes the thermal decomposition of further secondary acid generator, thus further increasing the amount of secondary acid present. The heat applied by the heated rollers 12 also raises the acid-generating layers 16, 22 and 28 and the color-change layers 18, 24 and 30 above their glass transition temperatures, thus causing the components present in each acid-generating layer to intermix with the components present in its associated color-change layer. Accordingly, the three associated pairs of acid-generating and color-change layers are "developed" and fixed as described above with reference to Table 1; i.e., the fixing reagent decomposes the remaining iodonium salt and the base neutralizes the acid produced by this decomposition. In the exposed areas, the secondary acid produced in the acid-generating layer effects the color change of the image dye in the associated color-change layer, thereby forming cyan, magenta and yellow images in the layers 18, 24 and 30 respectively. In the non-exposed areas, excess base remains and the image dye remains uncolored. The acid-impermeable interlayers 20 and 26 prevent the acids generated in the second and third acid-generating layers 22 and 28 respectively migrating to the first and second color-change layers 18 and 24 respectively, thus preventing crosstalk among the three images. The mixing of the components present in each bilayer also causes the base present in each of the color-change layers to deprotonate and/or nucleophilically attack the original forms of the sensitizing dyes present in the non-exposed areas of its associated acid-generating layer, thus removing the visible absorption due to the first forms of the sensitizing dyes, and reducing the $D_{min}$ of the images to a low level.

The following Examples are now given, though by way of illustration only, to show details of preferred reagents, conditions and techniques for use in the process and medium of the present invention.

EXAMPLE 1

Preparation of [3-[3-[bis[3-methylphenyl]amino] phenyl]propyl]-trimethylammonium Hexafluoroantimonate This Example illustrates the preparation of the triphenylamine supersensitizer of Formula SS-1 by a process in which an substituted aniline bearing an N,N-dimethylpropylamido substituent is condensed with two moles of an iodotoluene to produce an substituted N,N-dimethylpropylamidotriphenylamine, the carbonyl group of the dimethylpropylamido grouping is reduced to produce a dimethylaminopropyl grouping, and finally this grouping is quaternized and metathesis effected to produce the supersensitizer with the desired anion.

Part A: Preparation of N, N-dimethyl-3-nitrocinnamamide

To a suspension of m-nitrocinnamic acid (9.65 g, 50 mmole) in benzene (60 mL) was added thionyl chloride (16 g, 134 mmole) and dimethylformamide (DMF) (two drops). The resultant mixture was stirred at reflux for one hour, then allowed to stand at 20° C. overnight. Excess thionyl chloride and most of the benzene were removed by distillation, and the residue thus produced was taken up in tetrahydrofuran (THF) (25 mL) and the resultant solution added dropwise to a mixture of 40% aqueous dimethylamine (40 mL) in 150 mL of ice and water to give a precipitate. This precipitate was collected by filtration, washed with water (70 mL), sucked dry on the filter, and taken up in hot methanol (65 mL). The resultant solution was decolorized with activated charcoal (1.0 g), filtered, and cooled to 0° C. to give a precipitate which was collected by filtration and washed with cold methanol (20 mL), then dried overnight in vacuum to provide the desired product (8.829 g, 80.3% yield) in the form of colorless prisms.

Part B : Preparation of 3-aminohydrocinnamic acid dimethylamide

A suspension of nitrocinnamamide (8.75 g, 40 mmole, prepared in Part A above) and 10% palladium on charcoal (1.2 g) in ethanol (210 mL) was hydrogenated on a Parr shaker at 20° C. After 59 minutes hydrogen uptake had subsided, so the hydrogenation mixture was filtered through Celite, the filter being washed with methanol (25 mL). The filtrate was evaporated to give the desired product as a colorless oil (7.080 g, 92.7% yield), which solidified upon standing.

Part C : Preparation of 3-di-m-tolylaminohydrocinnamic acid dimethylamide

A mixture of 3-aminohydrocinnamic acid dimethylamide (7.0 g, 36.5 mmole, prepared in Part B above), 3-iodotoluene (23.8 g, 109 mmole), freshly-ground anhydrous potassium carbonate (20 g), 18-crown-6 ether (2.0 g), and copper powder (5.0 g) in o-dichlorobenzene (100 mL) was stirred at reflux with removal of water for 20 hours, then cooled to 20° C. and filtered to remove solids. The filtrate was chromatographed on silica gel, eluting successively with 1:1 methylene chloride/hexanes, methylene chloride, and 1%, 2%, 5%, and 10% methanol in methylene chloride to give the desired product as a brown oil (6.379 g, 47% yield).

Part D : Preparation of di-m-tolyl-3-(3-aminopropyl) phenylamine

A solution of 3-di-m-tolylaminohydrocinnamic acid dimethylamide (5.58 g, 15 mmole, prepared in Part C above) in diethyl ether (20 mL) was added dropwise to a suspension of lithium aluminum hydride (745 mg, 19.6 mmole, 78 equivalents) in diethyl ether (25 mL) at a rate such as to maintain reflux (over a period of approximately 7 minutes). The reaction mixture was then stirred at reflux for 75 minutes and cooled to 20° C. Excess lithium aluminum hydride was decomposed by dropwise addition of a solution of ethyl acetate (5 mL) in diethyl ether (10 mL). When the reaction mixture had finished refluxing after the ethyl acetate addition, it was diluted to 80 mL with diethyl ether and charged successively and dropwise, with a solution of water (0.74 g) in THF (5 mL), then 20% aqueous sodium hydroxide (0.52 g), and finally water (2.62 g) in THF (8 mL) to give a granular precipitate, which was removed by filtration. The filter cake was washed with ether (35 mL) and filtrate evaporated to give the desired product as an amber oil (4.864 g, 90.6% yield).

Part E: Preparation of [3-[3-[bis[3-methylphenyl]amino] phenyl]propyl]trimethylammonium hexafluoroantimonate To a solution of di-m-tolyl-3-(3-aminopropyl) phenylamine (3.46 g, 9.68 mmole, prepared in Part D above) in acetone (15 mL) was slowly added methyl iodide (2.0 mL). There was an immediate exotherm to reflux; when the exotherm had subsided, an additional 2.0 mL of methyl iodide was added and the reaction mixture stirred at 20° C. for three hours, then diluted with diethyl ether to 100 mL, giving a precipitate, which was stirred overnight at 20° C. The precipitate was collected by filtration, washed with ether (50 mL) and dried overnight in vacuum to provide the desired quaternary product as its iodide salt in the form of cream-colored fine prisms (4.273 g, 88.5% yield).

A 1.00 g (2.13 mmole) sample of this iodide salt was dissolved in methylene chloride (5 mL) and washed three times with aqueous hexafluoroantimonic acid; each wash consisted of 2 g of 68% acid diluted with 4 mL water. The resultant solution was washed with water (2 mL) and diluted with methyl t-butyl ether (MTBE) (6 mL) to produce a colorless precipitate, which was collected as fine colorless prisms and dried in vacuum to give the desired hexafluoroantimonate salt (1.222 g, 100.3% nominal yield).

(The hexafluoroantimonate salt is only moderately soluble in methylene chloride, so it may precipitate during the course of the separations. A subsequent preparation used 3 g of the iodide salt in 75 mL of methylene chloride. Evaporation of the washed methylene chloride solution to 20 mL before dilution with MTBE resulted in a quantitative yield of pure desired product.)

EXAMPLE 2

Preparation of dimethyl[3-[4-[bis[3-methylphenyl] amino]phenyl]-propyl]amine hexafluoroantimonic Acid Salt This Example illustrates the preparation of the triphenylamine supersensitizer of Formula SS-7, which is similar to that produced in Example 1 above but has a protonated dimethylamino ionic grouping in place of the trimethylammonium grouping of the supersensitizer prepared in Example 1.

To a solution of di-m-tolyl-3-(3-aminopropyl) phenylamine (1.14 g, 3.2 mmole, prepared in Example 1, Part D above) in methylene chloride (10 mL) was added a solution of 65% aqueous hexafluoroantimonic acid (3.5 g) in water (4 mL), and the resultant mixture was stirred for five minutes. The aqueous layer was decanted, and the organic layer washed with water (4.5 mL). The organic layer was then separated, filtered, and evaporated to 7 mL. The concentrated solution was then diluted with MTBE to 15 mL, evaporated to 7 mL, and diluted with MTBE to 25 mL, and the resulting precipitate was collected by filtration, washed with MTBE, and dried in vacuum to give the crude desired product (1.5 g) as a gray-green solid. This crude product was recrystallized from a mixed solvent containing ethyl acetate (0.8 mL), diethyl ether (2.5 mL), and hexanes (3 mL) to slowly deposit a solid, which was collected by filtration, washed with hexanes (4 mL) and dried in vacuum to give the desired pure product (656 mg, 35% yield) as colorless fine irregular prisms.

EXAMPLE 3

Preparation of [2-[4-[diphenylamino]phenyl] methoxyethyl]trimethylammonium Hexafluoroantimonate This Example illustrates the preparation of the triphenylamine supersensitizer of Formula SS-2 by a process in which a triphenylamine bearing a hydroxyethyl group is condensed with N,N-dimethyl-2-bromoacetamide, thereby replacing the hydroxyl group on the triphenylamine with an N,N-dimethylacetamido grouping, this grouping is reduced to a dimethylaminoethyl grouping, and finally this grouping is quatemized and metathesis effected to produce the supersensitizer with the desired anion.

Part A : Preparation of N,N-dimethyl-2-[4-[diphenylamino]phenyl]methoxyacetamide Sodium hydride (480 mg of a 60% dispersion in mineral oil, 12 mmole) was washed with hexanes (two 20 mL aliquots) and dispersed in DMF (20 mL) in a 250 mL round bottom flask maintained under nitrogen. 4-Diphenylaminobenzyl alcohol (2.75 g, 10 mmole) was added and the resultant mixture was stirred for 1 hour at ambient temperature. A solution of N,N-dimethyl-2-bromoacetamide (1.75 g, 10.5 mmole) in DMF (5 mL) was added dropwise and the reaction mixture was stirred at ambient temperature for 4 days. The reaction mixture was then quenched by adding 100 mL of ice-cold water, and extracted with methylene chloride (four 25 ml aliquots). The organic phases were combined, washed with water (two 50 mL aliquots), dried over magnesium sulfate and the methylene chloride removed to give 3.2 g of a crude product containing about 10% of unreacted benzyl alcohol starting material. This crude product was used in Part B below without further purification.

Part B : Preparation of dimethyl-[2-[4-[diphenylamino] phenyl]ethyl]amine

Lithium aluminum hydride (380 mg, 10 mmole) was suspended in THF (20 mL) in a 250 mL round bottom flask maintained under nitrogen. A solution of N,N-dimethyl-2-[4-[diphenylamino]phenyl]methoxyacetamide (3.1 g, 8.4 mmole, prepared in Part A above) in THF (20 mL) was added dropwise over a period of 10 minutes and the resultant reaction mixture was refluxed for 30 minutes. The flask was cooled in an ice bath, and ethyl acetate (5 mL) was added dropwise. The reaction mixture was then diluted with ether (50 mL) and charged successively with 0.5 mL of water, 0.5 mL of 20% aqueous sodium hydroxide and 2 mL of water, and then stirred for 15 minutes. The sodium lithium aluminate which precipitated was filtered through a Celite pad and washed with ether (20 mL), and the combined filtrate and washings were evaporated to give the desired product as a viscous yellow oil (3 g, essentially quantitative yield of crude product). This material was used in Part C below without further purification.

Part C: Preparation of [2-[4-[diphenylamino]phenyl] methoxyethyl]trimethylammonium iodide Crude dimethyl-[2-[4-[diphenylamino]phenyl]ethyl] amine (3 g, obtained in Part B above) was dissolved in acetone (15 mL), the resultant solution cooled in an ice bath, and iodomethane (2 g, in excess of the stoichiometric amount) was added dropwise. The ice bath was removed and the reaction mixture was magnetically stirred; a pale yellow precipitate appeared within a few minutes. Stirring at ambient temperature under nitrogen was continued for 2 hours, then the reaction mixture was diluted with 100 mL of ether and stirred for 1 further hour. Finally, the precipitate was filtered off, washed with ether (three 50 mL aliquots) and dried in a vacuum oven at approximately 30° C. to give the pure desired iodide salt (3.2 g, 80% yield).

Part D: Preparation of [2-[4-[diphenylamino]phenyl] methoxyethyl]trimethylammonium hexafluoroantimonate

[2-[4-[Diphenylamino]phenyl]methoxyethyl] trimethylammonium iodide (2.5 g, 5 mmole, prepared in Part C above) was dissolved in methylene chloride (20 mL) in a 250 mL round bottom flask. Aqueous hexafluoroantimonic acid (2 g of 68% aqueous acid in 15 mL of water) was added and the resultant mixture stirred for 10 minutes, then transferred to a separatory funnel. The organic phase was separated and washed with water (20 mL). The organic solution was then evaporated to about 10 mL and diluted with MTBE (50 mL), whereupon the desired hexafluoroantimonate salt precipitated out. The precipitate was filtered, washed with MTBE (two 20 mL aliquots) and dried in vacuum to give the desired pure salt as a grayish white solid (2.92 g, quantitative yield).

EXAMPLE 4

Preparation of [3-[3-[diphenylamino]phenoxy] propyl]trimethylammonium Hexafluoroantimonate This Example illustrates the preparation of the triphenylamine supersensitizer of Formula SS-13 by a process in which a triphenylamine bearing a hydroxyl group is condensed with an ω-bromoalkyltrimethylammonium salt, thereby converting the hydroxyl group on the triphenylamine to a substituted alkoxy grouping.

Part A: Preparation of 3-bromopropyltrimethylammonium bromide

Trimethylamine hydrochloride (9.6 g, 0.1 mole), 1,3-dibromopropane (40.5 g, 0.2 mole) and potassium carbonate (31 g, 0.22 mole) were placed in a 500 mL round bottom flask with acetonitrile (100 mL) and the resultant reaction mixture was stirred under nitrogen at ambient temperature for 4 days. The reaction mixture was then filtered under suction and the filter cake was thoroughly washed with acetonitrile (four 50 mL aliquots). The combined filtrate and washings were evaporated to dryness, the residue was dissolved in the minimum volume of warm acetonitrile (about 40–50 mL) and the resultant solution was diluted with ether (200 mL) and refrigerated for 2 hours. The precipitate which formed was filtered off, washed with ether (two 50 mL aliquots) and dried in a vacuum oven at approximately 30° C. to produce the desired product as a white crystalline solid (17.8 g, 68% yield).

Part B : Preparation of [3-[3-[diphenylamino]phenoxy] propyl]trimethylammonium hexafluoroantimonate 3-Hydroxytriphenylamine (1.31 g, 5 mmole), 3-bromopropyltrimethylammonium bromide (1.6 g, 6 mmole, prepared in Part A above), potassium carbonate (2.1 g, 15 mmole) and DMF (25 mL) were placed in a 250 mL round bottom flask and the resultant mixture was vigorously stirred under nitrogen at ambient temperature for 40 hours. Aqueous potassium bromide (50 mL of a 10% solution) was added, and the reaction mixture was extracted with methylene chloride (three 25 mL aliquots). The organic extracts were combined, evaporated to about 15 mL, stirred with aqueous hexafluoroantimonic acid (approximately 2 g of 68% aqueous acid in 15 mL of water) for 10 minutes, and then transferred to a separatory funnel. The organic phase was separated and the aqueous phase extracted with methylene chloride (10 mL). The original organic phase was combined with the methylene chloride extract, and the combined phases washed with aqueous hexafluoroantimonic acid (0.5 g of 68% aqueous acid in 20 mL of water) and then with water (25 mL). The organic phase was evaporated to about 5 to 7 mL and was diluted with 50–60 mL of MTBE, whereupon the crude product precipitated out as a gray solid. This solid was filtered off, washed with MTBE (25 mL) and dried in a vacuum oven at approximately 30° C. for 4 hours to give the desired product (1.5 g, 50% yield) as a light gray solid.

EXAMPLE 5

Preparation of [4-[10-[bis[3-methylphenyl]amino]phenoxydecyloxy]phenyl]phenyliodonium Hexafluoroantimonate This Example illustrates the preparation of the triphenylamine supersensitizer of Formula SS-12 by a process in which a triphenylamine bearing a hydroxyl group is condensed with an ω-bromoalkoxyiodonium salt, thereby converting the hydroxyl group on the triphenylamine to an iodonium-substituted alkoxy grouping.

Part A : Preparation of 10-phenoxydecyl bromide

To a solution of 1,10-dibromodecane (4.50 g, 15 mmole) in dimethyl sulfoxide (20 mL) was added freshly-pulverized anhydrous potassium carbonate (6.0 g), then phenol (1.41 g, 15 mmole). The resultant mixture was stirred at 20° C. for 12 hours, then quenched into water (200 mL). The resultant suspension was extracted with methylene chloride (30 mL) and the organic layer separated and washed with water (200 mL), then evaporated to give a colorless solid (5.90 g), which was chromatographed on silica gel, eluting with 90:10 hexanes/methylene chloride, to give the desired product as colorless fine irregular prisms (2.236 g, 48% yield).

Part B : Preparation of [10-bromodecyloxyphenyl]phenyliodonium bromide

A mixture of 10-phenoxydecyl bromide (1.88 g, 6.0 mmole, prepared in Part A above), hydroxy(tosyloxy)iodobenzene (2.35 g, 6.0 mmole), acetic acid (1.6 mL) and acetonitrile (20 mL) was stirred at 55° C. for ten minutes, then allowed to cool to 35° C. over a period of 1.5 hours. The resultant mixture was then diluted with saturated methanolic lithium bromide (10 mL); a precipitate formed, and the resultant slurry was left to stand at 20° C. for two hours, then filtered. The filter cake was washed with cold methanol (20 mL) and dried in vacuum to give the desired product as colorless fine matted needles (3.00 g, 84% yield, melting point 122–124° C.).

Part C : Preparation of 3-methoxyphenyl-bis(3-methylphenyl)amine

A mixture of m-anisidine (3.1 g, 25 mmole), 3-iodotoluene (13.1 g, 60 mmole), copper powder (3.8 g, 60 mmole), potassium carbonate (10.4 g, 75 mmole), 18-crown-6 ether (530 mg, 2 mmole) and 1,2-dichlorobenzene solvent (25 mL) was taken in a 250 mL round bottom flask under a nitrogen atmosphere and was refluxed for 8 hours. The reaction mixture was then cooled to about 75–80° C. and filtered warm. The solid residue was washed with hot hexanes (two 25 mL aliquots), and the filtrate and washings were combined, cooled to room temperature and filtered again. The filtrate was evaporated to dryness, using a hot water bath, to produce a brown oil (8.5 g), which was purified by flash chromatography (on silica gel, eluting with hexanes) to give the desired product as a pale yellow viscous oil (7.0 g, 92% yield).

Part D : Preparation of 3-hydroxyphenyl-bis(3-methylphenyl)amine

3-Methoxyphenyl-bis(3-methylphenyl)amine (6.5 g, 21.5 mmole, prepared in Part C above) was dissolved in methylene chloride (50 mL) in a 250 mL round bottom flask, which was cooled in a dry-ice/acetone bath. A solution of boron tribromide (10.8 g, 43 mmole) in methylene chloride (25 mL) was added dropwise over a period of 20 minutes, and the resultant reaction mixture was stirred at −78° C. for 1 hour, the cooling bath was removed, and the mixture was stirred at ambient temperature for a further 2 to 3 hours.

Following this stirring, the reaction mixture was cooled in an ice bath and quenched by adding ice-cold water (50 mL). The organic phase was removed and the aqueous phase extracted with methylene chloride (50 mL). The combined organic phase and extract were washed with brine (75 mL), dried over magnesium sulfate and evaporated to give a greenish-blue gummy syrup (6 g), which was purified by flash chromatography (on silica gel, eluting with a 95:5 hexanes/ethyl acetate mixture) to give the desired product as a light greenish-blue syrup (4.8 g, 77% yield).

Part E : Preparation of [4-[10-[bis[3-methylphenyl]amino]phenoxydecyloxy]phenyl]phenyliodonium hexafluoroantimonate A mixture of 3-hydroxyphenyl-bis(3-methylphenyl)amine (290 mg, 1 mmole, prepared in Part D above), [10-bromodecyloxyphenyl]phenyliodonium bromide (596 mg, 1 mmole, prepared in Part B above), potassium carbonate (345 mg, 2.5 mmole) and dimethylsulfoxide solvent (10 mL) in a 100 mL round bottom flask was stirred at ambient temperature for 20 hours. The mixture was then quenched by adding water (50 mL), whereupon a pale brown solid coagulated. The mother liquor was decanted off, the residue dissolved in methylene chloride (10 mL) and the resultant solution dried over magnesium sulfate, and solvent removed to give a yellow gummy syrup. This syrup was dissolved in methylene chloride (3 mL) and the resultant solution diluted with ether (50 mL), whereupon the crude desired product precipitated in the form of its bromide salt, which was collected and dried to give a yellowish foamy solid (450 mg, 53% yield).

This bromide salt (400 mg) was dissolved in methylene chloride (10 mL) and the resultant solution was stirred with aqueous hexafluoroantimonic acid (about 1 g of 68% aqueous acid in 10 mL of water) at ambient temperature for 10 minutes, and then the mixture was transferred to a separatory funnel. The organic phase was separated, washed with water (15 mL) and evaporated to about 2 to 3 mL. The concentrated solution was diluted with MTBE (30 mL), whereupon the desired product separated out as a gummy syrup. The mother liquor was decanted and the gummy product dried in vacuum to produce a pale yellow foamy powder (300 mg).

EXAMPLE 6

Preparation of [4-[3-[diphenylamino]phenoxy]butyl]triphenylphosphonium Hexafluoroantimonate This Example illustrates the preparation of the quaternary phosphonium triphenylamine supersensitizer of Formula SS-15 by a process exactly analogous to that of Example 4, Part B above.

3-Hydroxytriphenylamine (261 mg, 1 mmole) and 4-bromobutyltriphenylphosphonium bromide (480 mg, 1 mmole) were mixed in a 100 mL round bottom flask under a nitrogen atmosphere. Potassium carbonate (350 mg, 2.5 mmole) was added followed by DMF solvent (8 mL), and the resultant mixture was stirred for 4 days at ambient temperature. Aqueous potassium bromide (25 mL of a 10% solution) was then added and the resultant mixture stirred for 10 minutes, whereupon the crude desired product (in the form of its bromide salt) separated out as a brown gummy syrup. The mother liquor was decanted, the gummy material dissolved in methylene chloride (5 mL) and the resultant solution diluted with MTBE (30 mL). The mixture was vigorously stirred for 30 minutes and then allowed to settle. The mother liquor was decanted and the gummy product dried in vacuum to give an off-white foamy solid (325 mg, 50% yield).

This solid was dissolved in methylene chloride (5 mL) and aqueous hexafluoroantimonic acid (0.5 g of 68% aqueous acid in 5 mL of water) was added. The resultant mixture was stirred for 10 minutes, the organic layer separated and washed with water (10 mL), and then diluted with MTBE (30 mL) and stirred for 25 minutes. The mother liquor was decanted and the viscous gummy material which remained was dried in vacuum to give the desired product as an off-white foamy solid (250 mg, 62% yield).

EXAMPLE 7

Imaging

This Example compares the performance of three ionic supersensitizers of the present invention with that of three non-ionic supersensitizers of otherwise closely similar structure. Each pair of supersensitizers was tested with sensitizers absorbing red, green and blue light. Eighteen imaging media were therefore prepared, comprising the components listed below in the indicated coverages.

Each imaging medium consisted of two coated layers, a first acid-generating layer containing the primary acid generating components (an iodonium salt, a sensitizing dye and the supersensitizer) and the secondary acid generator, and a second, color-forming layer containing a leuco dye which changed color in the presence of the secondary acid, and a phenolic nucleophile. The coating fluids used to coat these two layers were made by dissolving the relevant components in 2-butanone (for the first layer) or ethanol (for the second layer). The fluid for the first layer was applied to a 5 mil (127 $\mu$m) poly(ethylene terephthalate) film base (Melinex reflective film base, supplied by ICI Americas, Inc., Wilmington, Del.) using a wire-wound coating rod, and the coating so produced was air-dried at room temperature and then baked at 70° C. for 5 minutes. The fluid for the second layer was then applied on top of the first layer, using a wire-wound coating rod, and the resultant structure was air-dried and baked in the same way.

The supersensitizers tested were SS-1 (prepared as described in Example 1 above), tris(3-methylphenyl)amine (the non-ionic control for SS-1, hereinafter referred to as "SS-1C"), SS-2 (prepared as described in Example 3 above), 1-(but1-oxymethyl)-4-diphenylaminobenzene (the non-ionic control for SS-2, hereinafter referred to as "SS-2C"), SS-13 (prepared as described in Example 4 above) and 4-diphenylamino-3-methoxybenzene (the non-ionic control for SS-13, hereinafter referred to as "SS-13C").

The red sensitizer used was 6-(but-2-oxy)-2-(1,1-dimethyleth-1-yl)-4(2-(9-phenylcarbazol-3-yl)ethen-1-yl) benz[b]pyrylium hexafluoroantimonate, the green sensitizer was 5-bromo-2-[2-[9-ethylcarbazol-3-yl]ethen-1-yl]-1-[2-hydroxyethyl]-3,3-dimethyl-3H-indolium hexafluoroantimonate, and the blue sensitizer was 2-(2,4-dimethoxyphenyl)-4-diphenylamino-6-phenylpyridinium hexafluoroantimonate. The preparation of the red and green sensitizers is described in copending application Ser. No. 08/858,659, filed May 19, 1997 and assigned to the same assignee as the present application; the blue sensitizer may be prepared in an analogous manner.

The first layer of each imaging medium comprised:

(a) The supersensitizer, at a coverage of 0.143 mmoles $m^{-2}$;

(b) The sensitizing dye, at a coverage of 0.016 mmoles $m^{-2}$;

(c) A cationic electron acceptor, namely diphenyliodonium hexafluoroantimonate, at a coverage of 0.132 mmoles $m^{-2}$;

(d) A secondary acid generator, namely 2-methoxy-2-[4-(4-phenylphenoxy)phenyl]but-1-yl diphenylphosphate (prepared as described in the aforementioned copending application Ser. No. 08/757,195), at a coverage of 0.583 mmoles $m^{-2}$; and (e) A polystyrene binder, namely Styron 663, available from Dow Chemical Company, Midland, Mich., at a coverage of 1366 mg $m^{-2}$.

The second layer of each imaging medium comprised:

(f) A leuco dye, namely (3',6'-bis[2,3,3-trimethylindolin-1-yl]spiro[2-[[2-hydroxyeth-1-oxy]eth-1-yl]-1,1-dioxo[1,2-benzisothiazole-3(3H),9'-(9H)xanthene]], at a coverage of 0.246 mmoles $m^{-2}$ (this dye changes from colorless to cyan in the presence of acid);

(g) A phenolic nucleophile, namely 4-benzyloxy-3-methoxy-phenol, at a coverage of 1.065 mmoles $m^{-2}$; and (h) A polymeric binder, namely poly(hydroxypropyl methacrylate), available from Aldrich Chemical Company, Milwaukee, Wis., at a coverage of 1266 mg $m^{-2}$.

The eighteen imaging media were exposed to filtered radiation from a tungsten lamp (EXW projection lamp, 82V, 300W, available from Apollo, Ronkonkoma, N.Y.). For the imaging media containing the red sensitizer, the radiation was filtered through a three-cavity interference filter having a bandpass of about 10 nm centered at 620 nm. For the imaging media containing the green and the blue sensitizers, similar three-cavity interference filters, centered at 544 nm and 440 nm, respectively, were used. After spectral filtration, the light from the tungsten lamp was passed through a spatial uniformizer which consisted of a tube of rectangular cross-section (24×36 mm), 38 cm in length, whose interior walls consisted of front-surface mirrors. The imaging medium was held in contact with a step wedge placed directly at the exit end of this uniforrnizer. The light intensity at the film plane was measured using a calibrated photodiode, and the duration of the exposure was 10 seconds.

Following exposure, the imaging media were developed by heating first at 90° C. for 15 seconds, and then at 140° C. for a further 15 seconds. The red reflection optical densities were then read using an X-Rite 310 photographic densitometer (supplied by X-Rite, Inc., Granville, Mich.) equipped with the appropriate filter (Status A).

The red densities were then fit (using a least-squares method) to the equation:

$$OD=D_{min}+(D_{max}-D_{min})(1+erf(\gamma/(\pi)^{0.5}(\log E-\log E50))$$

where erf denotes the error function, E is the exposure energy in mJ cm$^{-2}$, γ is the slope of the line relating red density to the logarithm of exposure energy, and E50 is the exposure energy required to generate a density halfway between $D_{min}$ and $D_{max}$.

Table 2 below shows E50 values (in mJ cm$^{-2}$) for the various combinations of sensitizer and supersensitizer, as well as the ratios of sensitivities between the ionic and non-ionic versions of the same supersensitizer.

TABLE 2

| Supersensitizer | Red (620 nm) | Green (544 nm) | Blue (440 nm) |
|---|---|---|---|
| SS-1 | 7.69 | 1.56 | 0.76 |
| SS-1C | 67.53 | 12.65 | 1.44 |
| Sensitivity Ratio SS-1/SS-1C | 8.78 | 8.11 | 1.89 |
| SS-2 | 18.99 | 2.20 | 0.81 |
| SS-2C | 92.18 | 7.33 | 1.40 |
| Sensitivity Ratio SS-1/SS-2C | 4.85 | 3.33 | 1.73 |
| SS-13 | 11.28 | 2.33 | 0.96 |
| SS-13C | 84.02 | 9.75 | 1.86 |
| Sensitivity Ratio SS-13/SS-13C | 7.45 | 4.18 | 1.94 |

It can be seen from Table 2 that in all cases the ionic supersensitizer produced a substantial increase in sensitivity as compared with its non-ionic counterpart, the increase in sensitivity varying from 73% to 778%.

We claim:

1. A process for generation of acid, which process comprises forming an acid-generating composition comprising:
    a cationic electron acceptor capable of decomposing to give an acid;
    a sensitizing dye which sensitizes the cationic electron acceptor to electromagnetic radiation of a wavelength to which the cationic electron acceptor is essentially insensitive in the absence of the sensitizing dye; and
    a supersensitizer having an oxidation potential lower than that of the sensitizing dye, the supersensitizer being an ionic compound having a cation comprising an ionic grouping, said grouping comprising at least one atom of an element from Group VB, VIB or VIIB of the Periodic Table;
    and exposing at least part of the acid-generating composition to electromagnetic radiation of a wavelength absorbed by the sensitizing dye, thereby generating the acid.

2. A process according to claim 1 wherein the ionic grouping of the supersensitizer comprises an ammonium, phosphonium, arsonium, sulfonium or iodonium group.

3. A process according to claim 1 wherein the supersensitizer has an oxidation potential of from about 700 to about 1100 mV relative to a standard calomel electrode.

4. A process according to claim 1 wherein, in the supersensitizer, the ionic grouping is connected to a triarylamino grouping.

5. A process according to claim 4 wherein, in the supersensitizer, the ionic grouping is bonded to an alkyl, alkenyl, alkoxy, alkoxyalkyl or oxyalkoxy grouping, and this alkyl, alkenyl, alkoxy, alkoxyalkyl or oxyalkoxy grouping forms a substituent on one of the aryl groups of the triarylamino grouping.

6. A process according to claim 2 wherein the ionic grouping of the supersensitizer is a tetra- or trisubstituted ammonium or phosphonium grouping, pyridinium grouping, or a disubstituted iodonium grouping, where in each case the substituents may be alkyl or aryl groups.

7. A process according to claim 1 wherein the supersensitizer has the same anion as the cationic electron acceptor.

8. A process according to claim 1 wherein the cation of the supersensitizer is selected from:
a [3-[3-[bis[3-methylphenyl]amino]phenyl]propyl] trimethylammonium cation;
a [2-[4-[diphenylamino]phenyl]methoxyethyl] trimethylammonium cation;
a N-[4-[3-[diphenylamino]phenoxy]butoxy]pyridinium cation;
a [2-[3-[diphenylamino]phenoxy]ethoxy] trimethylammonium cation;
a benzyldimethyl[4-[3-[diphenylamino]phenoxy]butoxy] ammonium cation;
a bis[2-[3-[diphenylamino]phenoxy]ethoxy] dimethylammonium cation;
a protonated dimethyl[3-[4-[bis[3-methylphenyl]amino] phenyl]propyl]ammonium cation;
a [2-[4-[bis[3-methylphenyl]amino]phenoxy]ethoxy] trimethylammonium cation;
a [2-[4-[bis[3-methylphenyl]amino]benzyloxy]ethoxy] trimethylammonium cation;
a [2-[3-[bis[3-methylphenyl]amino]phenoxy]ethoxy] trimethylammonium cation;
a [4-[3-[diphenylamino]phenyl]but-3-enyl] trimethylammonium cation;
a [4-[10-[bis[3-methylphenyl]amino]phenoxydecyloxy] phenyl]phenyliodonium cation;
a [3-[3-[diphenylamino]phenoxy]propyl] trimethylammonium cation;
a [4-[3-[diphenylamino]phenoxy]butyl]triethylammonium cation;
a [4-[3-[diphenylamino]phenoxy]butyl] triphenylphosphonium cation; and
a [4-[3-[diphenylamino]phenoxy]butyl] trimethylammonium cation.

9. A process according to claim 8 wherein the supersensitizer has a hexafluoroantimonate or perfluoroalkylsulfonate anion.

10. A process according to claim 1 wherein the cationic electron acceptor is an iodonium salt.

11. A process according to claim 10 wherein the salt is a diaryliodonium salt.

12. A process according to claim 1 wherein the acid-generating composition further comprises a secondary acid generator capable of thermal decomposition to form a secondary acid, the thermal decomposition of the secondary acid generator being catalyzed by the acid generated from the cationic electron acceptor,
    and wherein, following the exposure of the acid-generating composition to the electromagnetic radiation, the acid-generating composition is heated, thereby causing, in the parts of the acid-generating composition exposed to the radiation, acid-catalyzed decomposition of the secondary acid generator and generation of the secondary acid.

13. A process according to claim 12 wherein the secondary acid generator has a first site bearing a first leaving group and a second site bearing a second leaving group, the first leaving group being capable of protonation by the acid generated from the cationic electron acceptor, with expulsion of the first leaving group to form a cation, followed by:
    (i) loss of a proton from the cation to form an unstable intermediate, which then fragments with loss of the second leaving group, accompanied by either (a) loss of a second proton; or (b) addition of a proton-containing nucleophile, followed by loss of a proton; or (ii) electrophilic addition of the cation to an unsaturated reagent bearing a proton at the site of addition and a proton-containing nucleophilic grouping at an adjacent site, following which said proton on the reagent is lost and the second leaving group is displaced by said nucleophilic grouping;

the second leaving group, in combination with a proton, forming the secondary acid.

14. A process according to claim 13 wherein the secondary acid is capable of protonating the first leaving group of the secondary acid generator so that the acid-catalyzed thermal decomposition of the secondary acid generator is autocatalytic.

15. A process according to claim 12 wherein, after the secondary acid has been generated, this secondary acid contacts an acid-sensitive material capable of undergoing a color change in the presence of the secondary acid, thereby causing a color change in the parts of the acid-generating composition exposed to the radiation.

16. A process according to claim 1 wherein the sensitizing dye has a first form and a second form, the first form having substantially greater substantial absorption than the second form at the wavelength used to expose the acid-generating composition, the exposure of the acid-generating composition to the radiation is effected while at least part of the sensitizing dye is in its first form, and after the exposure, in at least the parts of the acid-generating composition not exposed to the radiation, the sensitizing dye is converted to its second form.

17. A process according to claim 16 wherein the sensitizing dye is of one of the formulae:

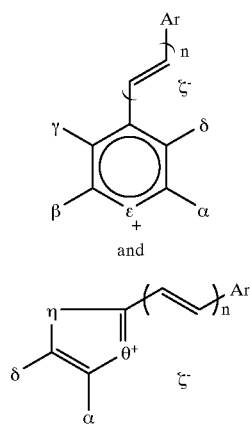

wherein:

α and δ are each a hydrogen atom or an organic group in which a carbon atom is directly bonded to the ring carrying the groups α and δ, or α and δ together comprise the atoms necessary to complete a substituted or unsubstituted benzene ring;

β and γ are each a hydrogen atom or an organic group in which a carbon atom is directly bonded to the ring carrying the groups β and γ, or β and γ together comprise the atoms necessary to complete a substituted or unsubstituted benzene ring;

ε is a oxygen, sulfur or selenium atom, or is an N—$R^a$ group, in which $R^a$ is a hydrogen atom, an alkyl group containing from about 1 to about 20 carbon atoms, or an aryl group;

ζ is an anion;

η is a $CR^cR^d$ group, a $CR^c$=$CR^d$ group, an oxygen or sulfur atom, or an N—$R^b$ group;

θ is an oxygen, sulfur or selenium atom, or is an N—$R^a$ group;

$R^a$ is a hydrogen atom, an alkyl group containing from about 1 to about 20 carbon atoms, and optionally bearing a protonated heteroatom substituent, or an aryl group;

$R^b$ is an alkyl group containing from about 1 to about 20 carbon atoms, or an aryl group;

$R^c$ and $R^d$ are each independently a hydrogen atom, an alkyl group containing from about 1 to about 20 carbon atoms or an aryl group;

n is 0, 1, 2 or 3; and

Ar is an aryl or heterocyclyl group.

18. A process according to claim 17 wherein the sensitizing dye is a triarylpyridinium dye.

19. A process according to claim 1 wherein, after the exposure, in at least the parts of the acid-generating composition not exposed to the radiation, the cationic electron acceptor is reacted with a reactive material which irreversibly destroys the cationic electron acceptor, thereby rendering the acid-generating composition substantially insensitive to radiation.

20. A process for producing an image, which process comprises forming an acid-generating composition comprising:

an iodonium salt capable of decomposing to give an acid;

a sensitizing dye which sensitizes the iodonium salt to electromagnetic radiation of a wavelength to which the salt is essentially insensitive in the absence of the sensitizing dye, this sensitizing dye being of one of the formulae:

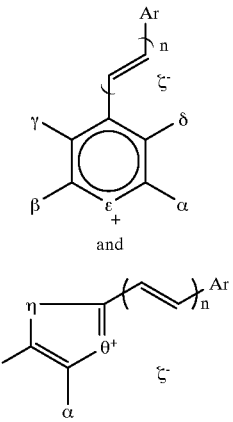

(wherein:

α and δ are each a hydrogen atom or an organic group in which a carbon atom is directly bonded to the ring carrying the groups α and δ, or α and δ together comprise the atoms necessary to complete a substituted or unsubstituted benzene ring;

β and γ are each a hydrogen atom or an organic group in which a carbon atom is directly bonded to the ring carrying the groups β and γ, or β and γ together comprise the atoms necessary to complete a substituted or unsubstituted benzene ring;

ε is a oxygen, sulfur or selenium atom, or is an N—$R^a$ group, in which $R^a$ is a hydrogen atom, an alkyl group containing from about 1 to about 20 carbon atoms, or an aryl group;

ζ is an anion;

η is a $CR^c R^d$ group, a $CR^c = CR^d$ group, an oxygen or sulfur atom, or an $N—R^b$ group;

θ is an oxygen, sulfur or selenium atom, or is an $N—R^a$ group;

$R^a$ is a hydrogen atom, an alkyl group containing from about 1 to about 20 carbon atoms, and optionally bearing a protonated heteroatom substituent, or an aryl group;

$R^b$ is an alkyl group containing from about 1 to about 20 carbon atoms, or an aryl group;

$R^c$ and $R^d$ are each independently a hydrogen atom, an alkyl group containing from about 1 to about 20 carbon atoms or an aryl group;

n is 0, 1, 2 or 3; and

Ar is an aryl or heterocyclyl group);

a supersensitizer having an oxidation potential lower than that of the sensitizing dye, the supersensitizer being an ionic compound having a cation comprising an ionic grouping selected from the group consisting of ammonium, phosphonium, arsonium, sulfonium and iodonium groupings; and a secondary acid generator capable of thermal decomposition to form a secondary acid, the thermal decomposition of the secondary acid generator being catalyzed by the acid generated from the iodonium salt;

imagewise exposing the acid-generating composition to electromagnetic radiation of a wavelength absorbed by the sensitizing dye, thereby generating the acid from the iodonium salt;

heating the acid-generating composition following the exposure, thereby causing, in the parts of the acid-generating composition exposed to the radiation, acid-catalyzed decomposition of the secondary acid generator and generation of the secondary acid; and contacting the secondary acid thus produced with an acid-sensitive material capable of undergoing a color change in the presence of the secondary acid, thereby causing the color change to occur in the parts of the acid-generating composition exposed to the radiation, and forming an image.

21. An acid-generating composition comprising:

a cationic electron acceptor capable of decomposing to give an acid;

a sensitizing dye which sensitizes the cationic electron acceptor to electromagnetic radiation of a wavelength to which the cationic electron acceptor is essentially insensitive in the absence of the sensitizing dye; and a supersensitizer having an oxidation potential lower than that of the sensitizing dye, the supersensitizer being an ionic compound having a cation comprising an ionic grouping, said grouping comprising at least one atom of an element from Group VB, VIB or VIIB of the Periodic Table.

22. A composition according to claim 21 wherein the ionic grouping of the supersensitizer comprises an ammonium, phosphonium, arsonium, sulfonium or iodonium group.

23. A composition according to claim 21 wherein the supersensitizer has an oxidation potential of from about 700 to about 1100 mV relative to a standard calomel electrode.

24. A composition according to claim 21 wherein, in the supersensitizer, the ionic grouping is connected to a triarylamino grouping.

25. A composition according to claim 24 wherein, in the supersensitizer, the ionic grouping is bonded to an alkyl, alkenyl, alkoxy, alkoxyalkyl or oxyalkoxy grouping, and this alkyl, alkenyl, alkoxy, alkoxyalkyl or oxyalkoxy grouping forms a substituent on one of the aryl groups of the triarylamino grouping.

26. A composition according to claim 22 wherein the ionic grouping of the supersensitizer is a tetra- or trisubstituted ammonium or phosphonium grouping, pyridinium grouping, or a disubstituted iodonium grouping, where in each case the substituents may be alkyl or aryl groups.

27. A composition according to claim 21 wherein the supersensitizer has the same anion as the cationic electron acceptor.

28. A composition according to claim 21 wherein the cation of the supersensitizer is selected from:

a [3-[3-[bis[3-methylphenyl]amino]phenyl]propyl] trimethylammonium cation;

a [2-[4-[diphenylamino]phenyl]methoxyethyl] trimethylammonium cation;

a N-[4-[3-[diphenylamino]phenoxy]butoxy]pyridinium cation;

a [2-[3-[diphenylamino]phenoxy]ethoxy] trimethylammonium cation;

a benzyldimethyl[4-[3-[diphenylamino]phenoxy]butoxy] ammonium cation;

a bis[2-[3-[diphenylamino]phenoxy]ethoxy] dimethylammonium cation;

a protonated dimethyl[3-[4-[bis[3-methylphenyl]amino] phenyl]propyl]ammonium cation;

a [2-[4-[bis[3-methylphenyl]amino]phenoxy]ethoxy] trimethylammonium cation;

a [2-[4-[bis[3-methylphenyl]amino]benzyloxy]ethoxy] trimethylammonium cation;

a [2-[3-[bis[3-methylphenyl]amino]phenoxy]ethoxy] trimethylammonium cation;

a [4-[3-[diphenylamino]phenyl]but-3-enyl] trimethylammonium cation;

a [4-[10-[bis[3-methylphenyl]amino]phenoxydecyloxy] phenyl]phenyliodonium cation;

a [3-[3-[diphenylamino]phenoxy]propyl] trimethylammonium cation;

a [4-[3-[diphenylamino]phenoxy]butyl]triethylammonium cation;

a [4-[3-[diphenylamino]phenoxy]butyl] triphenylphosphonium cation; and a [4-[3-[diphenylamino]phenoxy]butyl] trimethylammonium cation.

29. A composition according to claim 28 wherein the supersensitizer has a hexafluoroantimonate or perfluoroalkylsulfonate anion.

30. A composition according to claim 21 wherein the cationic electron acceptor is an iodonium salt.

31. A composition according to claim 30 wherein the salt is a diaryliodonium salt.

32. A composition according to claim 21 further comprising a secondary acid generator capable of thermal decomposition to form a secondary acid, the thermal decomposition of the secondary acid generator being catalyzed by the acid generated from the cationic electron acceptor.

33. A composition according to claim 32 wherein the secondary acid generator has a first site bearing a first leaving group and a second site bearing a second leaving group, the first leaving group being capable of protonation by the acid generated from the cationic electron acceptor, with expulsion of the first leaving group to form a cation, followed by:

(i) loss of a proton from the cation to form an unstable intermediate, which then fragments with loss of the second leaving group, accompanied by either (a) loss of a second proton; or (b) addition of a proton-containing nucleophile, followed by loss of a proton; or (ii) electrophilic addition of the cation to an unsaturated reagent bearing a proton at the site of addition and a proton-containing nucleophilic grouping at an adjacent site, following which said proton on the reagent is lost and the second leaving group is displaced by said nucleophilic grouping;

the second leaving group, in combination with a proton, forming the secondary acid.

34. A composition according to claim 33 wherein the first site of the secondary acid generator is capable of being protonated by the secondary acid so that the acid-catalyzed thermal decomposition of the secondary acid generator is autocatalytic.

35. An imaging medium comprising:
an acid-generating layer or phase comprising a composition according to claim 21; and
a color-change layer or phase comprising an image dye capable of undergoing a color change on contact with the acid generated from the cationic electron acceptor.

36. An imaging medium comprising:
an acid-generating layer or phase comprising a composition according to claim 32; and
a color-change layer or phase comprising an image dye capable of undergoing a color change on contact with the secondary acid.

37. An imaging medium according to claim 36 wherein the sensitizing dye has a first form and a second form, the first form having substantially greater substantial absorption than the second form at a wavelength to which the sensitizing dye sensitizes the cationic electron acceptor, and wherein the color-change layer or phase comprises a reagent capable of converting the first form of the sensitizing dye to its second form.

38. A composition according to claim 37 wherein the sensitizing dye is of one of the formulae:

carrying the groups β and γ, or β and γ together comprise the atoms necessary to complete a substituted or unsubstituted benzene ring;

ε is a oxygen, sulfur or selenium atom, or is an N—$R^a$ group, in which $R^a$ is a hydrogen atom, an alkyl group containing from about 1 to about 20 carbon atoms, or an aryl group;

ζ is an anion;

η is a $CR^cR^d$ group, a $CR^c$=$CR^d$ group, an oxygen or sulfur atom, or an N—$R^b$ group;

θ is an oxygen, sulfur or selenium atom, or is an N—$R^a$ group;

$R^a$ is a hydrogen atom, an alkyl group containing from about 1 to about 20 carbon atoms, and optionally bearing a protonated heteroatom substituent, or an aryl group;

$R^b$ is an alkyl group containing from about 1 to about 20 carbon atoms, or an aryl group;

$R^c$ and $R^d$ are each independently a hydrogen atom, an alkyl group containing from about 1 to about 20 carbon atoms or an aryl group;

n is 0, 1, 2 or 3; and

Ar is an aryl or heterocyclyl group.

39. A composition according to claim 38 wherein the sensitizing dye is a triarylpyridinium dye.

40. An imaging medium according to claim 36 wherein the color-change layer or phase comprises a reagent capable of irreversibly destroying the cationic electron acceptor, thereby rendering the acid-generating composition substantially insensitive to radiation.

41. An imaging medium comprising:
an acid-generating composition comprising:
an iodonium salt capable of decomposing to give an acid;
a sensitizing dye which sensitizes the iodonium salt to electromagnetic radiation of a wavelength to which the salt is essentially insensitive in the absence of the sensitizing dye, this sensitizing dye being of one of the formulae:

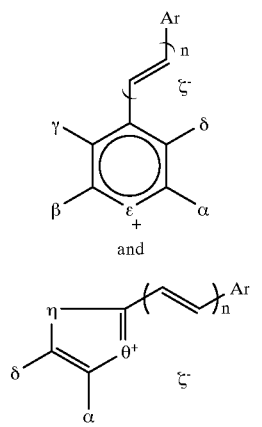

and

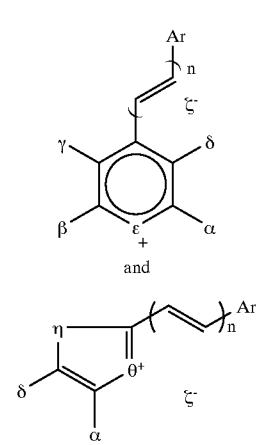

(I)

and wherein:
α and δ are each a hydrogen atom or an organic group in which a carbon atom is directly bonded to the ring carrying the groups α and δ, or α and δ together comprise the atoms necessary to complete a substituted or unsubstituted benzene ring;
β and γ are each a hydrogen atom or an organic group in which a carbon atom is directly bonded to the ring (wherein:
α and δ are each a hydrogen atom or an organic group in which a carbon atom is directly bonded to the ring carrying the groups α and δ, or α and δ together comprise the atoms necessary to complete a substituted or unsubstituted benzene ring;
β and γ are each a hydrogen atom or an organic group in which a carbon atom is directly bonded to the ring carrying the groups β and γ, or β and γ together comprise the atoms necessary to complete a substituted or unsubstituted benzene ring;

ε is a oxygen, sulfur or selenium atom, or is an N—$R^a$ group, in which $R^a$ is a hydrogen atom, an alkyl group containing from about 1 to about 20 carbon atoms, or an aryl group;

ζ is an anion;

η is a $CR^cR^d$ group, a $CR^c$=$CR^d$ group, an oxygen or sulfur atom, or an N—$R^b$ group;

θ is an oxygen, sulfur or selenium atom, or is an N—$R^a$ group;

$R^a$ is a hydrogen atom, an alkyl group containing from about 1 to about 20 carbon atoms, and optionally bearing a protonated heteroatom substituent, or an aryl group;

$R^b$ is an alkyl group containing from about 1 to about 20 carbon atoms, or an aryl group;

$R^c$ and $R^d$ are each independently a hydrogen atom, an alkyl group containing from about 1 to about 20 carbon atoms or an aryl group;

n is 0, 1, 2 or 3; and

Ar is an aryl or heterocyclyl group);

a supersensitizer having an oxidation potential lower than that of the sensitizing dye, the supersensitizer being an ionic compound having a cation comprising an ionic grouping selected from the group consisting of ammonium, phosphonium, arsonium, sulfonium and iodonium groupings; and a secondary acid generator capable of thermal decomposition to form a secondary acid, the thermal decomposition of the secondary acid generator being catalyzed by the acid generated from the iodonium salt; and a color-change layer or phase comprising an image dye capable of undergoing a color change on contact with the secondary acid.

\* \* \* \* \*